(12) United States Patent
Humayun et al.

(10) Patent No.: US 9,159,571 B2
(45) Date of Patent: Oct. 13, 2015

(54) TUNGSTEN DEPOSITION PROCESS USING GERMANIUM-CONTAINING REDUCING AGENT

(71) Applicant: Lam Research Corporation, Fremont, CA (US)

(72) Inventors: Raashina Humayun, Los Altos, CA (US); Sudha Manandhar, Fremont, CA (US); Michal Danek, Cupertino, CA (US)

(73) Assignee: Lam Research Corporation, Fremont, CA (US)

(*) Notice: Subject to any disclaimer, the term of this patent is extended or adjusted under 35 U.S.C. 154(b) by 0 days.

(21) Appl. No.: 14/173,733

(22) Filed: Feb. 5, 2014

(65) Prior Publication Data

US 2014/0154883 A1 Jun. 5, 2014

Related U.S. Application Data

(63) Continuation-in-part of application No. 14/097,160, filed on Dec. 4, 2013, which is a continuation of application No. 12/755,259, filed on Apr. 6, 2010, now Pat. No. 8,623,733.

(60) Provisional application No. 61/921,266, filed on Dec. 27, 2013, provisional application No. 61/169,954, filed on Apr. 16, 2009.

(51) Int. Cl.
*H01L 21/20* (2006.01)
*H01L 21/285* (2006.01)
(Continued)

(52) U.S. Cl.
CPC ...... *H01L 21/28556* (2013.01); *C23C 16/0281* (2013.01); *C23C 16/045* (2013.01); *C23C 16/14* (2013.01); *C23C 16/45525* (2013.01); *H01L 21/28562* (2013.01); *H01L 21/67207* (2013.01);
(Continued)

(58) Field of Classification Search
CPC ...... H01L 21/285; H01L 21/67; H01L 21/768
USPC ................ 438/675, 380; 118/698
See application file for complete search history.

(56) References Cited

U.S. PATENT DOCUMENTS

| 4,746,375 A | * | 5/1988 | Iacovangelo | 148/220 |
| 4,804,560 A | * | 2/1989 | Shioya et al. | 438/675 |

(Continued)

FOREIGN PATENT DOCUMENTS

| EP | 0 437 110 | 7/1991 |
| EP | 1 156 132 | 11/2001 |

(Continued)

OTHER PUBLICATIONS

U.S. Appl. No. 13/862,048, filed Apr. 12, 2013, entitled "CVD Based Metal/Semiconductor OHMIC Contact for High Volume Manufacturing Applications,".

(Continued)

*Primary Examiner* — Caleb Henry
(74) *Attorney, Agent, or Firm* — Weaver Austin Villenuve & Sampson LLP

(57) ABSTRACT

Methods for depositing low resistivity tungsten in features of substrates in semiconductor processing are disclosed herein. Methods involve using a germanium-containing reducing agent during tungsten nucleation layer deposition to achieve thin, low resistivity nucleation layers.

15 Claims, 11 Drawing Sheets

(51) Int. Cl.
*H01L 21/67* (2006.01)
*H01L 21/768* (2006.01)
*C23C 16/02* (2006.01)
*C23C 16/04* (2006.01)
*C23C 16/14* (2006.01)
*C23C 16/455* (2006.01)

(52) U.S. Cl.
CPC .... *H01L 21/76861* (2013.01); *H01L 21/76876* (2013.01); *H01L 21/76877* (2013.01)

(56) References Cited

U.S. PATENT DOCUMENTS

| | | | |
|---|---|---|---|
| 4,874,719 A * | 10/1989 | Kurosawa | 438/637 |
| 4,962,063 A | 10/1990 | Maydan et al. | |
| 5,028,565 A * | 7/1991 | Chang et al. | 438/654 |
| 5,227,329 A | 7/1993 | Kobayashi et al. | |
| 5,250,329 A | 10/1993 | Miracky et al. | |
| 5,250,467 A | 10/1993 | Somekh et al. | |
| 5,308,655 A | 5/1994 | Eichman et al. | |
| 5,326,723 A | 7/1994 | Petro et al. | |
| 5,370,739 A | 12/1994 | Foster et al. | |
| 5,391,394 A | 2/1995 | Hansen | |
| 5,567,583 A | 10/1996 | Wang et al. | |
| 5,661,080 A | 8/1997 | Hwang et al. | |
| 5,726,096 A | 3/1998 | Jung | |
| 5,795,824 A | 8/1998 | Hancock | |
| 5,804,249 A | 9/1998 | Sukharev et al. | |
| 5,817,576 A | 10/1998 | Tseng et al. | |
| 5,833,817 A | 11/1998 | Tsai et al. | |
| 5,913,145 A | 6/1999 | Lu et al. | |
| 5,926,720 A | 7/1999 | Zhao et al. | |
| 5,956,609 A | 9/1999 | Lee et al. | |
| 5,963,833 A * | 10/1999 | Thakur | 438/677 |
| 5,994,749 A | 11/1999 | Oda | |
| 6,001,729 A | 12/1999 | Shinriki et al. | |
| 6,017,818 A | 1/2000 | Lu | |
| 6,034,419 A | 3/2000 | Nicholls et al. | |
| 6,037,263 A | 3/2000 | Chang | |
| 6,066,366 A | 5/2000 | Berenbaum et al. | |
| 6,099,904 A | 8/2000 | Mak et al. | |
| 6,107,200 A | 8/2000 | Takagi et al. | |
| 6,143,082 A | 11/2000 | McInerney et al. | |
| 6,174,812 B1 | 1/2001 | Hsiung et al. | |
| 6,206,967 B1 | 3/2001 | Mak et al. | |
| 6,245,654 B1 | 6/2001 | Shih et al. | |
| 6,265,312 B1 | 7/2001 | Sidhwa et al. | |
| 6,277,744 B1 | 8/2001 | Yuan et al. | |
| 6,284,316 B1 * | 9/2001 | Sandhu et al. | 427/96.8 |
| 6,294,468 B1 | 9/2001 | Gould-Choquette et al. | |
| 6,297,152 B1 | 10/2001 | Itoh et al. | |
| 6,306,211 B1 * | 10/2001 | Takahashi et al. | 117/86 |
| 6,309,966 B1 | 10/2001 | Govindarajan et al. | |
| 6,310,300 B1 | 10/2001 | Cooney et al. | |
| 6,355,558 B1 | 3/2002 | Dixit et al. | |
| 6,404,054 B1 | 6/2002 | Oh et al. | |
| 6,429,126 B1 | 8/2002 | Herner et al. | |
| 6,465,347 B2 | 10/2002 | Ishizuka et al. | |
| 6,491,978 B1 | 12/2002 | Kalyanam | |
| 6,551,929 B1 | 4/2003 | Kori et al. | |
| 6,566,250 B1 | 5/2003 | Tu et al. | |
| 6,566,262 B1 | 5/2003 | Rissman et al. | |
| 6,581,258 B2 | 6/2003 | Yoneda et al. | |
| 6,593,233 B1 | 7/2003 | Miyazaki et al. | |
| 6,607,976 B2 | 8/2003 | Chen et al. | |
| 6,635,965 B1 | 10/2003 | Lee et al. | |
| 6,706,625 B1 | 3/2004 | Sudijono et al. | |
| 6,720,261 B1 | 4/2004 | Anderson et al. | |
| 6,740,585 B2 | 5/2004 | Yoon et al. | |
| 6,777,331 B2 | 8/2004 | Nguyen | |
| 6,797,340 B2 | 9/2004 | Fang et al. | |
| 6,844,258 B1 | 1/2005 | Fair et al. | |
| 6,861,356 B2 | 3/2005 | Matsuse et al. | |
| 6,902,763 B1 | 6/2005 | Elers et al. | |
| 6,903,016 B2 | 6/2005 | Cohen | |
| 6,905,543 B1 | 6/2005 | Fair et al. | |
| 6,908,848 B2 | 6/2005 | Koo | |
| 6,936,538 B2 | 8/2005 | Byun | |
| 6,939,804 B2 | 9/2005 | Lai et al. | |
| 6,962,873 B1 | 11/2005 | Park | |
| 7,005,372 B2 | 2/2006 | Levy et al. | |
| 7,141,494 B2 | 11/2006 | Lee et al. | |
| 7,157,798 B1 | 1/2007 | Fair et al. | |
| 7,211,144 B2 | 5/2007 | Lu et al. | |
| 7,220,671 B2 | 5/2007 | Simka et al. | |
| 7,235,486 B2 | 6/2007 | Kori et al. | |
| 7,262,125 B2 | 8/2007 | Wongsenakhum et al. | |
| 7,355,254 B2 | 4/2008 | Datta et al. | |
| 7,416,979 B2 | 8/2008 | Yoon et al. | |
| 7,419,904 B2 | 9/2008 | Kato | |
| 7,429,402 B2 | 9/2008 | Gandikota et al. | |
| 7,465,665 B2 | 12/2008 | Xi et al. | |
| 7,465,666 B2 | 12/2008 | Kori et al. | |
| 7,501,343 B2 | 3/2009 | Byun et al. | |
| 7,501,344 B2 | 3/2009 | Byun et al. | |
| 7,563,718 B2 | 7/2009 | Kim | |
| 7,589,017 B2 | 9/2009 | Chan et al. | |
| 7,595,263 B2 * | 9/2009 | Chung et al. | 438/633 |
| 7,605,083 B2 | 10/2009 | Lai et al. | |
| 7,611,990 B2 | 11/2009 | Yoon et al. | |
| 7,655,567 B1 | 2/2010 | Gao et al. | |
| 7,674,715 B2 | 3/2010 | Kori et al. | |
| 7,675,119 B2 | 3/2010 | Taguwa | |
| 7,691,749 B2 | 4/2010 | Levy et al. | |
| 7,695,563 B2 | 4/2010 | Lu et al. | |
| 7,709,385 B2 | 5/2010 | Xi et al. | |
| 7,732,327 B2 | 6/2010 | Lee et al. | |
| 7,745,329 B2 | 6/2010 | Wang et al. | |
| 7,745,333 B2 | 6/2010 | Lai et al. | |
| 7,749,815 B2 | 7/2010 | Byun | |
| 7,754,604 B2 | 7/2010 | Wongsenakhum et al. | |
| 7,772,114 B2 | 8/2010 | Chan et al. | |
| 7,955,972 B2 | 6/2011 | Chan et al. | |
| 7,964,505 B2 * | 6/2011 | Khandelwal et al. | 438/680 |
| 7,977,243 B2 | 7/2011 | Sakamoto et al. | |
| 8,048,805 B2 | 11/2011 | Chan et al. | |
| 8,053,365 B2 | 11/2011 | Humayun et al. | |
| 8,058,170 B2 | 11/2011 | Chandrashekar et al. | |
| 8,062,977 B1 | 11/2011 | Ashtiani et al. | |
| 8,087,966 B2 | 1/2012 | Hebbinghaus et al. | |
| 8,101,521 B1 | 1/2012 | Gao et al. | |
| 8,110,877 B2 | 2/2012 | Mukherjee et al. | |
| 8,207,062 B2 | 6/2012 | Gao et al. | |
| 8,258,057 B2 | 9/2012 | Kuhn et al. | |
| 8,329,576 B2 | 12/2012 | Chan et al. | |
| 8,367,546 B2 * | 2/2013 | Humayun et al. | 438/675 |
| 8,409,985 B2 | 4/2013 | Chan et al. | |
| 8,409,987 B2 | 4/2013 | Chandrashekar et al. | |
| 8,551,885 B2 | 10/2013 | Chen et al. | |
| 8,623,733 B2 | 1/2014 | Chen et al. | |
| 8,709,948 B2 | 4/2014 | Danek et al. | |
| 8,853,080 B2 | 10/2014 | Guan et al. | |
| 8,975,184 B2 | 3/2015 | Chen et al. | |
| 8,993,055 B2 * | 3/2015 | Rahtu et al. | 427/249.17 |
| 2001/0008808 A1 | 7/2001 | Gonzalez | |
| 2001/0014533 A1 | 8/2001 | Sun | |
| 2001/0015494 A1 | 8/2001 | Ahn | |
| 2001/0044041 A1 | 11/2001 | Badding et al. | |
| 2002/0037630 A1 | 3/2002 | Agarwal et al. | |
| 2002/0090796 A1 | 7/2002 | Desai et al. | |
| 2002/0117399 A1 | 8/2002 | Chen et al. | |
| 2002/0132472 A1 | 9/2002 | Park | |
| 2002/0155722 A1 | 10/2002 | Satta et al. | |
| 2002/0168840 A1 | 11/2002 | Hong et al. | |
| 2002/0177316 A1 | 11/2002 | Miller et al. | |
| 2003/0059980 A1 | 3/2003 | Chen et al. | |
| 2003/0091870 A1 | 5/2003 | Bhowmik et al. | |
| 2003/0104126 A1 | 6/2003 | Fang et al. | |
| 2003/0123216 A1 | 7/2003 | Yoon et al. | |
| 2003/0127043 A1 | 7/2003 | Lu et al. | |
| 2003/0129828 A1 | 7/2003 | Cohen et al. | |
| 2003/0190802 A1 | 10/2003 | Wang et al. | |
| 2004/0014315 A1 | 1/2004 | Lai et al. | |
| 2004/0044127 A1 | 3/2004 | Okubo et al. | |

(56) References Cited

U.S. PATENT DOCUMENTS

| | | |
|---|---|---|
| 2004/0142557 A1 | 7/2004 | Levy et al. |
| 2004/0151845 A1* | 8/2004 | Nguyen et al. ............ 427/569 |
| 2004/0202786 A1 | 10/2004 | Wongsenakhum et al. |
| 2004/0206267 A1 | 10/2004 | Sambasivan et al. |
| 2005/0031786 A1 | 2/2005 | Lee et al. |
| 2005/0059236 A1 | 3/2005 | Nishida et al. |
| 2005/0136594 A1 | 6/2005 | Kim |
| 2005/0179141 A1 | 8/2005 | Yun et al. |
| 2005/0191803 A1 | 9/2005 | Matsuse et al. |
| 2006/0003581 A1 | 1/2006 | Johnston et al. |
| 2006/0075966 A1 | 4/2006 | Chen et al. |
| 2006/0094238 A1 | 5/2006 | Levy et al. |
| 2006/0145190 A1 | 7/2006 | Salzman et al. |
| 2006/0211244 A1 | 9/2006 | Deshpande et al. |
| 2006/0284317 A1 | 12/2006 | Ito et al. |
| 2007/0087560 A1* | 4/2007 | Kwak et al. ............ 438/637 |
| 2007/0099420 A1 | 5/2007 | Dominguez et al. |
| 2007/0190780 A1 | 8/2007 | Chung et al. |
| 2008/0045010 A1 | 2/2008 | Wongsenakhum et al. |
| 2008/0081127 A1 | 4/2008 | Thompson et al. |
| 2008/0081453 A1 | 4/2008 | Kim et al. |
| 2008/0124926 A1 | 5/2008 | Chan et al. |
| 2008/0254619 A1 | 10/2008 | Lin et al. |
| 2008/0254623 A1 | 10/2008 | Chan et al. |
| 2008/0280438 A1 | 11/2008 | Lai et al. |
| 2009/0045517 A1 | 2/2009 | Sugiura et al. |
| 2009/0053893 A1 | 2/2009 | Khandelwal et al. |
| 2009/0149022 A1 | 6/2009 | Chan et al. |
| 2009/0160030 A1 | 6/2009 | Tuttle |
| 2009/0163025 A1 | 6/2009 | Humayun et al. |
| 2009/0315154 A1 | 12/2009 | Kirby et al. |
| 2010/0035427 A1 | 2/2010 | Chan et al. |
| 2010/0055904 A1 | 3/2010 | Chen et al. |
| 2010/0130002 A1 | 5/2010 | Dao et al. |
| 2010/0130003 A1 | 5/2010 | Lin et al. |
| 2010/0155846 A1 | 6/2010 | Mukherjee et al. |
| 2010/0159694 A1 | 6/2010 | Chandrashekar et al. |
| 2010/0244141 A1 | 9/2010 | Beyer et al. |
| 2010/0267230 A1 | 10/2010 | Chandrashekar et al. |
| 2010/0267235 A1 | 10/2010 | Chen et al. |
| 2010/0273327 A1 | 10/2010 | Chan et al. |
| 2010/0330800 A1* | 12/2010 | Ivanov et al. ............ 438/622 |
| 2011/0059608 A1 | 3/2011 | Gao et al. |
| 2011/0156154 A1 | 6/2011 | Hoentschel et al. |
| 2011/0221044 A1 | 9/2011 | Danek et al. |
| 2011/0223763 A1 | 9/2011 | Chan et al. |
| 2011/0233778 A1 | 9/2011 | Lee et al. |
| 2011/0236594 A1 | 9/2011 | Haverkamp et al. |
| 2012/0009785 A1 | 1/2012 | Chandrashekar et al. |
| 2012/0015518 A1 | 1/2012 | Chandrashekar et al. |
| 2012/0040530 A1 | 2/2012 | Humayun et al. |
| 2012/0199887 A1 | 8/2012 | Chan et al. |
| 2012/0231626 A1 | 9/2012 | Lee et al. |
| 2012/0244699 A1 | 9/2012 | Khandelwal et al. |
| 2012/0294874 A1* | 11/2012 | Macary et al. ............ 424/174.1 |
| 2013/0043554 A1 | 2/2013 | Piper |
| 2013/0062677 A1 | 3/2013 | Li et al. |
| 2013/0109172 A1 | 5/2013 | Collins et al. |
| 2013/0168864 A1 | 7/2013 | Lee et al. |
| 2013/0171822 A1 | 7/2013 | Chandrashekar et al. |
| 2013/0285195 A1 | 10/2013 | Piper |
| 2013/0302980 A1* | 11/2013 | Chandrashekar et al. .... 438/666 |
| 2014/0011358 A1 | 1/2014 | Chen et al. |
| 2014/0027664 A1 | 1/2014 | Lei et al. |
| 2014/0030889 A1 | 1/2014 | Chen et al. |
| 2014/0061931 A1 | 3/2014 | Kang |
| 2014/0073135 A1 | 3/2014 | Guan et al. |
| 2014/0154883 A1* | 6/2014 | Humayun et al. ............ 438/675 |
| 2014/0162451 A1 | 6/2014 | Chen et al. |
| 2014/0308812 A1 | 10/2014 | Arghavani et al. |
| 2015/0037972 A1* | 2/2015 | Danek et al. ............ 438/643 |
| 2015/0056803 A1 | 2/2015 | Chandrashekar et al. |

FOREIGN PATENT DOCUMENTS

| | | |
|---|---|---|
| EP | 1 179 838 | 2/2002 |
| JP | 08-115984 | 5/1996 |
| JP | 09-027596 | 1/1997 |
| JP | H10-144688 | 5/1998 |
| JP | H10-163132 | 6/1998 |
| JP | 11-330006 | 11/1999 |
| JP | 2000-208516 | 7/2000 |
| JP | 2000-235962 | 8/2000 |
| JP | 2001-525889 | 12/2001 |
| JP | 2002-124488 | 4/2002 |
| JP | 2004-235456 | 8/2004 |
| JP | 2004-273764 | 9/2004 |
| JP | 2005-029821 | 2/2005 |
| JP | 2005-518088 | 6/2005 |
| JP | 2007-009298 | 1/2007 |
| JP | 2007-027627 | 2/2007 |
| JP | 2007-027680 | 2/2007 |
| JP | 2007-507892 | 3/2007 |
| JP | 2007-520052 | 7/2007 |
| JP | 2007-250907 | 9/2007 |
| JP | 2007-251164 | 9/2007 |
| JP | 2008-016803 | 1/2008 |
| JP | 2008-060603 | 3/2008 |
| JP | 2008-091844 | 4/2008 |
| JP | 2008-283220 | 11/2008 |
| JP | 2009-024252 | 2/2009 |
| JP | 2009-144242 | 7/2009 |
| JP | 2009-540123 | 11/2009 |
| KR | 10-2002-0049730 | 6/2002 |
| KR | 10-2005-0022261 | 3/2005 |
| KR | 10-2005-0087428 | 8/2005 |
| KR | 10-2006-0087844 | 8/2006 |
| KR | 705936 | 4/2007 |
| KR | 10-2008-0036679 | 4/2008 |
| KR | 10-2008-0110897 | 12/2008 |
| KR | 10-2009-0103815 | 10/2009 |
| WO | WO 98/51838 | 11/1998 |
| WO | WO 01/27347 | 4/2001 |
| WO | WO 01/29893 | 4/2001 |
| WO | WO 02/41379 | 5/2002 |
| WO | WO 03/029515 | 4/2003 |
| WO | WO 2005/027211 | 3/2005 |
| WO | WO 2005/034223 | 4/2005 |
| WO | WO 2007/121249 | 10/2007 |
| WO | WO 2007/146537 | 12/2007 |
| WO | WO 2010/025357 | 3/2010 |
| WO | WO 2011/119293 | 9/2011 |
| WO | WO 2013/090295 | 6/2013 |
| WO | WO 2013/148444 | 10/2013 |
| WO | WO 2013/148880 | 10/2013 |
| WO | WO 2014/058536 | 4/2014 |

OTHER PUBLICATIONS

U.S. Appl. No. 14/135,375, filed Dec. 19, 2013, entitled "Method for Depositing Extremely Low Resistivity Tungsten,".

U.S. Appl. No. 13/758,928, filed Feb. 4, 2013, entitled "Methods for Forming All Tungsten Contacts and Lines."

U.S. Appl. No. 14/097,160, filed Dec. 4, 2013, entitled "Methods for Depositing Ultra Thin Low Resistivity Tungsten Film for Small Critical Dimension Contacts and Interconnects."

U.S. Appl. No. 13/928,216, filed Jun. 26, 2013, entitled "Methods of Forming Tensile Tungsten Films and Compressive Tungsten Films,".

US Office Action, dated Apr. 7, 2014, issued in U.S. Appl. No. 13/633,502.

US Office Action, dated May 30, 2014, issued in U.S. Appl. No. 13/862,048.

US Office Action, dated Jul. 17, 2002, issued in U.S. Appl. No. 09/975,074.

US Notice of Allowance, dated Mar. 12, 2003, issued in U.S. Appl. No. 09/975,074.

US Office Action, dated Feb. 8, 2005, issued in U.S. Appl. No. 10/649,351.

US Final Office Action, dated Jul. 14, 2005, issued in U.S. Appl. No. 10/649,351.

(56) References Cited

OTHER PUBLICATIONS

US Office Action, dated Dec. 30, 2005, issued in U.S. Appl. No. 10/649,351.
US Notice of Allowance, dated Jul. 21, 2006, issued in U.S. Appl. No. 10/649,351.
US Office Action, dated Jun. 22, 2004, issued in U.S. Appl. No. 10/435,010.
US Notice of Allowance, dated Oct. 7, 2004, issued in U.S. Appl. No. 10/435.010.
US Notice of Allowance, dated Jan. 19, 2005, issued in U.S. Appl. No. 10/435,010.
US Office Action, dated Nov. 23, 2005, issued in U.S. Appl. No. 10/984,126.
US Final Office Action, dated May 17, 2006, issued in U.S. Appl. No. 10/984,126.
US Notice of Allowance, dated Aug. 25, 2006, issued in U.S. Appl. No. 10/984,126.
US Office Action, dated Mar. 23, 2005, issued in U.S. Appl. No. 10/690,492.
US Notice of Allowance, dated Sep. 14, 2005, issued in U.S. Appl. No. 10/690,492.
US Office Action, dated Jun. 27, 2008, issued in U.S. Appl. No. 11/305,368.
US Office Action, dated Apr. 3, 2009, issued in U.S. Appl. No. 11/305,368.
US Notice of Allowance, dated Nov. 17, 2009, issued in U.S. Appl. No. 11/305,368.
US Office Action, dated Jul. 12, 2015, issued in U.S. Appl. No. 10/815,560.
US Final Office Action, dated Dec. 28, 2005, issued in U.S. Appl. No. 10/815,560.
US Office Action, dated Apr. 17, 2006, issued in U.S. Appl. No. 10/815,560.
US Office Action, dated Sep. 28, 2006, issued in U.S. Appl. No. 10/815,560.
US Notice of Alowance,, dated Apr. 24, 2007, issued in U.S. Appl. No. 10/815,560.
US Office Action, dated Aug. 21, 2008, issued in U.S. Appl. No. 11/265,531.
US Final Office Action, dated Feb. 26, 2009, issued in U.S. Appl. No. 11/265,531.
US Notice of Allowance, dated May 4, 2009, issued in U.S. Appl. No. 11/265,531.
US Office Action, dated Nov. 23, 2010, issued in U.S. Appl. No. 12/538,770.
US Notice of Allowance, dated Jun. 30, 2011, issued in U.S. Appl. No. 12/538,770.
US Office Action, dated Oct. 16, 2008, issued in U.S. Appl. No. 11/349,035.
US Final Office Action, dated Feb. 25, 2009, issued in U.S. Appl. No. 11/349,035.
US Office Action, dated Jun. 4, 2009, issued in U.S. Appl. No. 11/349,035.
US Final Office Action, dated Nov. 20, 2009, issued in U.S. Appl. No. 11/349,035.
US Notice of Allowance, dated Mar. 2, 2010, issued in U.S. Appl. No. 11/349,035.
US Office Action, dated Sep. 29, 2008, issued in U.S. Appl. No. 11/782,570.
US Final Office Action, dated Apr. 28, 2009, issued in U.S. Appl. No. 11/782,570.
US Notice of Allowance, dated Sep. 17, 2009, issued in U.S. Appl. No. 11/782,570.
US Office Action, dated Jan. 25, 2011, issued in U.S. Appl. No. 12/636,616.
US Final Office Action, dated Jun. 15, 2011, issued in U.S. Appl. No. 12/636,616.
US Notice of Allowance, dated Sep. 30, 2011, issued in U.S. Appl. No. 12/636,616.
US Office Action, dated Jun. 24, 2009, issued in U.S. Appl. No. 12/030,645.
US Final Office Action, dated Jan. 13, 2010, issued in U.S. Appl. No. 12/030,645.
US Final Office Action, dated Jul. 23, 2010, issued in U.S. Appl. No. 12/030,645.
US Notice of Allowance and Fee Due, dated Jan. 24, 2011, issued in U.S. Appl. No. 12/030,645.
US Office Action, dated Aug. 6, 2012, issued in U.S. Appl. No. 13/095,734.
Notice of Allowance dated Dec. 3, 2012, issued in U.S. Appl. No. 13/095,734.
US Office Action, dated Aug. 5, 2009, issued in U.S. Appl. No. 11/951,236.
US Final Office Action, dated Jan. 26, 2010 from U.S. Appl. No. 11/951,236.
US Notice of Allowance, dated Apr. 6, 2010, issued in U.S. Appl. No. 11/951,236.
US Office Action, dated Jun. 30, 2011, issued in U.S. Appl. No. 12/829,119.
US Final Office Action, dated Nov. 17, 2011, issued in U.S. Appl. No. 12/829,119.
US Office Action, dated Apr. 19, 2012, issued in U.S. Appl. No. 12/829,119.
US Notice of Allowance, dated Aug. 7, 2012, issued in U.S. Appl. No. 12/829,119.
US Office Action, dated Jun. 11, 2009, issued in U.S. Appl. No. 11/963,698.
US Final Office Action, dated Dec. 9, 2009, issued in U.S. Appl. No. 11/963,698.
US Office Action, dated Jun. 11, 2010, issued in U.S. Appl. No. 11/963,698.
US Final Office Action, dated Dec. 30, 2010, issued in U.S. Appl. No. 11/963,698.
US Notice of Allowance, dated Sep. 2, 2011, issued in U.S. Appl. No. 11/963,698.
US Office Action, dated Apr. 16, 2012, issued in U.S. Appl. No. 13/726,170.
US Notice of Allowance, dated Oct. 4, 2012, issued in U.S. Appl. No. 13/276,170.
US Notice of Allowance, dated Jul. 25, 2011, issued in U.S. Appl. No. 12/363,330.
US Office Action dated Oct. 21, 2009, issued in U.S. Appl. No. 12/202,126.
US Final Office Action, dated May 7, 2010, issued in U.S. Appl. No. 12/202,126.
US Office Action, dated Jul. 26, 2010 issued in U.S. Appl. No. 12/202,126.
US Final Office Action, dated Feb. 7, 2011, issued in U.S. Appl. No. 12/202,126.
US Office Action, dated Jan. 7, 2013, issued in U.S. Appl. No. 12/202,126.
US Notice of Allowance, dated Jun. 7, 2013, issued in U.S. Appl. No. 12/202,126.
US Office Action, dated May 3, 2010, issued in U.S. Appl. No. 12/407,541.
US Final Office Action, dated Oct. 19, 2010, issued in U.S. Appl. No. 12/407,541.
US Office Action, dated May 2, 2011, issued in U.S. Appl. No. 12/407,541.
US Notice of Allowance, dated Sep. 19, 2011, issued in U.S. Appl. No. 12/407,541.
US Office Action, dated Mar. 6, 2012, issued in U.S. Appl. No. 13/244,016.
US Notice of Allowance dated Nov. 29, 2012, issued in U.S. Appl. No. 13/244,016.
US Office Action, dated Jun. 14, 2011, issued in U.S. Appl. No. 12/556,490.
US Notice of Allowance, dated Mar. 2, 2012, issued in U.S. Appl. No. 12/556,490.
US Office Action, dated May 13, 2011, issued in U.S. Appl. No. 12/755,248.

(56) References Cited

OTHER PUBLICATIONS

US Office Action, dated Oct. 28, 2011, issued in U.S. Appl. No. 12/755,248.
US Final Office Action, dated Apr. 30, 2012, issued in U.S. Appl. No. 12/755,248.
US Office Action, dated Feb. 15, 2013, issued in U.S. Appl. No. 12/755,248.
US Office Action dated Dec. 18, 2012, issued in U.S. Appl. No. 12/723,532.
US Office Action dated Jul. 18, 2013, issued in U.S. Appl. No. 12/723,532.
US Notice of Allowance dated Dec. 24, 2013, issued in U.S. Appl. No. 12/723,532.
US Office Action, dated Feb. 16, 2012, issued in U.S. Appl. No. 12/755,259.
US Final Office Action, dated Sep. 12, 2012, issued in U.S. Appl. No. 12/755,259.
US Notice of Allowance, dated Jul. 10, 2013, issued in U.S. Appl. No. 12/755,259.
US Notice of Allowance dated Sep. 4, 2013 issued in U.S. Appl. No. 12/755,259.
US Office Action, dated May 10, 2012, issued in U.S. Appl. No. 13/020,748.
US Final Office Action, dated Nov. 16, 2012, issued in U.S. Appl. No. 13/020,748.
US Office Action, dated Feb. 24, 2014, issued in U.S. Appl. No. 13/020,748.
US Office Action, dated Jun. 20, 2013, issued in U.S. Appl. No. 13/560,688.
US Final Office Action, dated Feb. 14, 2014, issued in U.S. Appl. No. 13/560,688.
US Office Action, dated Jun. 14, 2013, issued in U.S. Appl. No. 13/633,798.
US Final Office Action, dated Nov. 26, 2013, issued in U.S. Appl. No. 13/633,798.
US Notice of Allowance, dated May 23, 2014, issued in U.S. Appl. No. 13/633,798.
PCT Search Report and Written Opinion, dated Jan. 19, 2005, issued in PCT/US2004/006940.
Korean First Notification of Provisional Rejection, dated Dec. 8, 2010, issued in Application No. 2004-0036346.
Korean Office Action, dated Jun. 13, 2011, issued in Application No. 2011-0032098.
Korean Office Action, dated Nov. 24, 2010, issued in Application No. KR 10-2004-0013210.
Korean Office Action, dated Mar. 28, 2013, issued in Application No. KR 10-2007-0012027.
Japanese Office Action dated May 7, 2013 issued in Application No. JP 2008-310322.
Japanese Office Action dated Sep. 3, 2013 issued in Application No. JP 2008-325333.
PCT International Search Report and Written Opinion, dated Apr. 12, 2010, issued in PCT/US2009/055349.
PCT International Preliminary Report on Patentability and Written Opinion, dated Mar. 10, 2011, issued in PCT/US2009/055349.
Chinese First Office Action dated Sep. 18, 2012 issued in Application No. 200980133560.1.
Chinese Second Office Action dated Aug. 7, 2013 issued in Application No. 200980133560.1.
Japanese Office Action dated Dec. 3, 2013 issued in Application No. 2011-525228.
Korean Office Action dated Sep. 6, 2012 issued in Application No. 2011-7004322.
Korean Office Action dated Jul. 19, 2013 issued in Application No. 2011-7004322.
Korean Office Action dated Nov. 4, 2013 issued in Application No. 10-2013-7027117.
Korean Office Action dated Mar. 21, 2013 issued in KR Application No. 10-2010-0024905.
Japanese Office Action dated Mar. 4, 2014 issued in JP 2010-093522.
Korean Notification of Provisional Rejection dated Jul. 17, 2012, issued in Application No. 2010-0087997.
Korean Office Action dated Mar. 4, 2013 in KR Application No. 2010-0035449.
Korean Second Office Action dated Jan. 25, 2014 in KR Application No. 10-2010-0035453.
PCT International Search Report and Written Opinion, dated Jun. 28, 2013, issued in PCT/US2013/033174.
PCT International Search Report and Written Opinion, dated Jul. 26, 2013, issued in PCT/US2013/034167.
Becker, Jill (Apr. 7, 2003) "Diffusion barrier properties of tungsten nitride films grown by atomic layer deposition from bis(tert-butylimido)bis(dimethylamido)tungsten and ammonia," Applied Physics Letters, 82(14):2239-2241, [Retrieved online Dec. 13, 2013 at http://dx.doi.org/10.1063/1.1565699].
Bell et al., (Jan. 1996) "Batch Reactor Kinetic Studies of Tungsten LPCVD from Silane and Tungsten Hexafluoride", J. Electrochem. Soc., 143(1):296-302.
Collins, et al., (Jan. 21, 2003) "Pulsed Deposition of Ultra Thin Tungsten for Plugfill of High Aspect Ratio Contacts," Presentation made at Semicon Korea, 9 pages
Collins, et al., (Jan. 21, 2003) "Pulsed Deposition of Ultra Thin Tungsten for Plugfill of High Aspect Ratio Contacts," Semiconductor Equipment and Materials International, Semicon Korea, 3 pages.
Diawara, Y. et al. (1993) "Rapid thermal annealing for reducing stress in tungsten x-ray mask absorber," http://dx/doi.org/10.1116/1.586673, Journal of Vacuum Science & Technology B 11:296-300 (per table of contents of journal).
Elam et al, (2001) "Nucleation and Growth During Tungsten Atomic Layer Deposition on SiO2 Surfaces," Thin Solid Films, 2001, 13pp.
Fair, James A. (1983) Presentation by Inventor "Chemical Vapor Deposition of Refractory Metal Silicides," GENUS Incorporated, 27 pp.
George et al., (1996) "Surface Chemistry for atomic Layer Growth", J. Phys. Chem, 1996, vol. 100, No. 31, pp. 13121-13131.
Gonohe, Narishi (2002) "Tungsten Nitride Deposition by Thermal Chemical Vapor Deposition as Barrier Metal for Cu Interconnection," [http://www.jim.co.jp/journal/e/pdf3/43/07/1585.pdf.], Materials Transactions, 43(7):1585-1592.
Hoover, Cynthia, (Jul. 2007) "Enabling Materials for Contact Metallization," Praxair Electronic Materials R&D, pp. 1-16.
Klaus et al., (2000) "Atomic layer deposition of tungsten using sequential surface chemistry with a sacrificial stripping reaction", Thin Solid Films 360:145-153.
Klaus et al., (2000) "Atomically Controlled Growth of Tungsten and Tungsten Nitride Using Sequential Surface Reactions," Applied Surface Science, pp. 162-163, 479-491.
Lai, Ken et al. (Jul. 17, 2000) "Tungsten chemical vapor deposition using tungsten hexacarbonyl: microstructure of as-deposited and annealed films," [http://dx.doi.org/10-1016/S0040-6090(00)00943-3], Thin Solid Films, 370:114-121.
Lai, Ken K. and Lamb, H. Henry (1995) "Precursors for Organometallic Chemical Vapor Deposition of Tungsten Carbide Films," Chemistry Material, 7(12):2284-2292.
Lee et al., (Jan. 21, 2003) "Pulsed Deposition of Ultra Thin Tungsten and its Application for Plugfill of High Aspect Ratio Contacts," Abstract, 1 page.
Li et al., (2002) "Deposition of WNxCy—Thin Films by ALCVDTM Method for Diffusion Barriers in Metallization," IITC Conference Report, 2002, 3 pp.
Manik. P, et al. (2012) "Fermi-level unpinning and low resistivity in contacts to n-type Ge with a thin ZnO interfacial layer," App. Phys. Lett. 101:182105-5.
Saito et al., (2001) "A Novel Copper Interconnection Technology Using Self Aligned Metal Capping Method," IEEE, 3pp.
Shioya, Yoshimi et al. (Dec. 1, 1985) "Analysis of stress in chemical vapor deposition tungsten silicide film," [Retrieved online Dec. 18, 2013 at http://dx.doi.org/10.1063/1.335552], Journal of Applied Physics, 58(11):4194-4199.
US Final Office Action, dated Jul. 2, 2014, issued in U.S. Appl. No. 13/020,748.
US Office Action, dated Sep. 18, 2014, issued in U.S. Appl. No. 13/928,216.

(56) References Cited

OTHER PUBLICATIONS

Chinese Third Office Action dated Apr. 22, 2014 issued in Application No. 200980133560.1.
Korean Office Action dated Jun. 17, 2014 issued in Application No. 10-2013-7027117.
Japanese Office Action dated Jun. 17, 2014 issued in Application No. JP 2010-055163.
Japanese Office Action dated Jul. 29, 2014 issued in JP 2010-093544.
US Final Office Action, dated Nov. 5, 2014, issued in U.S. Appl. No. 13/633,502.
US Notice of Allowance, dated Mar. 2, 2015, issued in U.S. Appl. No. 13/633,502.
US Final Office Action, dated Oct. 16, 2014, issued in U.S. Appl. No. 13/862,048.
US Office Action, dated Dec. 18, 2014, issued in U.S. Appl. No. 14/097,160.
US Office Action, dated Jan. 15, 2015, issued in U.S. Appl. No. 13/774,350.
US Office Action, dated Dec. 23, 2014, issued in U.S. Appl. No. 13/851,885.
US Office Action, dated Dec. 18, 2014, issued in U.S. Appl. No. 14/502,817.
US Notice of Allowance, dated Jan. 22, 2015, issued in U.S. Appl. No. 13/928,216.
US Notice of Allowance, dated Nov. 4, 2014, issued in U.S. Appl. No. 13/560,688.
Chinese Fourth Office Action dated Jan. 5, 2015 issued in Application No. 200980133560.1.
Taiwan Office Action dated Dec. 27, 2014 issued in TW 099111860.
PCT International Preliminary Report on Patentability and Written Opinion, dated Oct. 9, 2014, issued in PCT/US2013/033174.
PCT International Preliminary Report on Patentability and Written Opinion, dated Oct. 9, 2014, issued in PCT/US2013/034167.

* cited by examiner

TUNGSTEN DEPOSITION PROCESS USING GERMANIUM-CONTAINING REDUCING AGENT

CROSS-REFERENCE TO RELATED APPLICATION

This application claims benefit under 35 U.S.C. §119(e) of U.S. Provisional Patent Application No. 61/921,266, filed Dec. 27, 2013, and titled "TUNGSTEN NUCLEATION PROCESS TO ENABLE LOW RESISTIVITY TUNGSTEN FEATURE FILL," which is herein incorporated by reference in its entirety and for all purposes. This application is also a continuation-in-part of U.S. patent application Ser. No. 14/097,160, filed Dec. 4, 2013, and titled "METHODS FOR DEPOSITING ULTRA THIN LOW RESISTIVITY TUNGSTEN FILM FOR SMALL CRITICAL DIMENSION CONTACTS AND INTERCONNECTS," which is a continuation of U.S. patent application Ser. No. 12/755,259 (now U.S. Pat. No. 8,623,733), filed Apr. 6, 2010, and also titled METHODS FOR DEPOSITING ULTRA THIN LOW RESISTIVITY TUNGSTEN FILM FOR SMALL CRITICAL DIMENSION CONTACTS AND INTERCONNECTS," which claims benefit under 35 U.S.C. §119(e) of U.S. Provisional Patent Application No. 61/169,954, filed Apr. 16, 2009 and titled "METHOD FOR FORMING TUNGSTEN CONTACTS AND INTERCONNECTS WITH SMALL CRITICAL DIMENSIONS." Each of the prior applications is incorporated by reference herein in its entirety and for all purposes.

BACKGROUND

Deposition of tungsten-containing materials is an integral part of many semiconductor fabrication processes. These materials may be used for horizontal interconnects, vias between adjacent metal layers, contacts between first metal layers and devices on the silicon substrate, and high aspect ratio features. In a conventional tungsten deposition process on a semiconductor substrate, the substrate is heated to the process temperature in a vacuum chamber, and a very thin portion of tungsten film which serves as a seed or nucleation layer is deposited. Thereafter, the remainder of the tungsten film (the bulk layer) is deposited on the nucleation layer. The bulk layer is generally deposited more rapidly than the nucleation layer.

Increasingly thin tungsten electrical connects having very low resistance will enable smaller critical dimension devices. Although conventional methods are able to deposit nucleation layers, their ability to provide nucleation layers for the deposition of low resistivity tungsten in small critical dimension features is limited. For example, the formation of logic contacts has become more challenging as aspect ratios grow to more than 10:1. Void-free fill in aggressive features like these is problematic using conventional tungsten deposition techniques.

SUMMARY

Provided herein are methods for depositing tungsten, including methods for filling a feature on a substrate with tungsten.

In one aspect, a method of filling a feature on a substrate with tungsten involves, prior to depositing a bulk tungsten layer, forming a tungsten nucleation layer by exposing the feature to alternating pulses of a germanium-containing reducing agent and a tungsten-containing precursor. In various embodiments, the tungsten nucleation layer formed has a thickness between about 1 nm and 20 nm. In some embodiments, the tungsten nucleation layer formed has a thickness less than about 1 nm. In various embodiments, the amount of tungsten deposited per cycle is less than about 8 Å.

In certain embodiments, the tungsten nucleation layer is formed in a hydrogen atmosphere. In various embodiments, substantially all of the tungsten formed in the feature is alpha-tungsten. In many embodiments, the germanium-containing reducing agent is germane ($GeH_4$) or digermane ($Ge_2H_6$).

In some embodiments, the method also includes depositing a bulk tungsten layer by chemical vapor deposition. In certain embodiments, the grain growth during the bulk tungsten layer deposition extends from a first site where tungsten nucleated to a second site where tungsten nucleated in the feature. In many embodiments, substantially all of the tungsten formed during deposition of the bulk tungsten layer is alpha-tungsten.

Another aspect involves a method of filling a feature on a substrate with tungsten by forming a tungsten nucleation layer, and, after forming the tungsten nucleation layer and prior to depositing a tungsten bulk layer, treating the tungsten nucleation layer to pulses of a germanium-containing reducing agent. In various embodiments, there are no intervening pulses of other precursors during the treatment. In certain embodiments, intervening pulses of a tungsten-containing precursor are performed such that the amount of the tungsten-containing precursor pulsed during the treatment is less than the amount of the tungsten-containing precursor pulsed during the nucleation layer formation. In some embodiments, substantially no tungsten is deposited during the treatment with intervening pulses of tungsten-containing precursor. In many embodiments, the germanium-containing reducing agent is germane ($GeH_4$) or digermane ($Ge_2H_6$).

Another aspect involves an apparatus for filling a feature on a substrate including a multi-chamber apparatus with a chamber and a controller for controlling operations in the apparatus. The chamber may include a substrate support and one or more gas inlets configured to expose the substrate to gases. The controller may include machine-readable instructions for exposing the feature to alternating pulses of a germanium-containing reducing agent and a tungsten-containing precursor.

In various embodiments, the controller also includes instructions for flowing hydrogen into the chamber while the feature is exposed to the alternating pulses of the germanium-containing reducing agent and the tungsten-containing precursor. In many embodiments, the germanium-containing reducing agent is germane ($GeH_4$) or digermane ($Ge_2H_6$). In various embodiments, the multi-chamber apparatus also includes a treatment chamber, and the controller also includes instructions for pulsing a germanium-containing reducing agent without intervening pulses of a tungsten-containing precursor.

These and other aspects are described further below with reference to the drawings.

DETAILED DESCRIPTION

In the following description, numerous specific details are set forth to provide a thorough understanding of the presented embodiments. The disclosed embodiments may be practiced without some or all of these specific details. In other instances, well-known process operations have not been described in detail to not unnecessarily obscure the disclosed embodiments. While the disclosed embodiments will be described in conjunction with the specific embodiments, it will be understood that it is not intended to limit the disclosed embodiments.

There are various challenges in tungsten (W) fill as devices scale to smaller technology nodes. One challenge is preventing an increase in resistance due to the thinner films in contacts and vias. As features become smaller, the tungsten contact or line resistance increases due to scattering effects in the thinner tungsten films. Low resistivity tungsten films minimize power losses and overheating in integrated circuit designs. Conventional chemical vapor deposition (CVD) tungsten deposition processes involve depositing a nucleation layer followed by CVD bulk tungsten deposition. While efficient tungsten deposition processes use tungsten nucleation layers, these layers typically have higher electrical resistivities than the bulk layers. Barrier layers deposited in contacts, vias, and other features, may also have high resistivities. Further, the thin barrier and tungsten nucleation films occupy a larger percentage of smaller features, increasing the overall resistance in the feature. Resistivity of a tungsten film depends on the thickness of the film deposited, increasing at very low thicknesses due to boundary effects.

Figure 1:
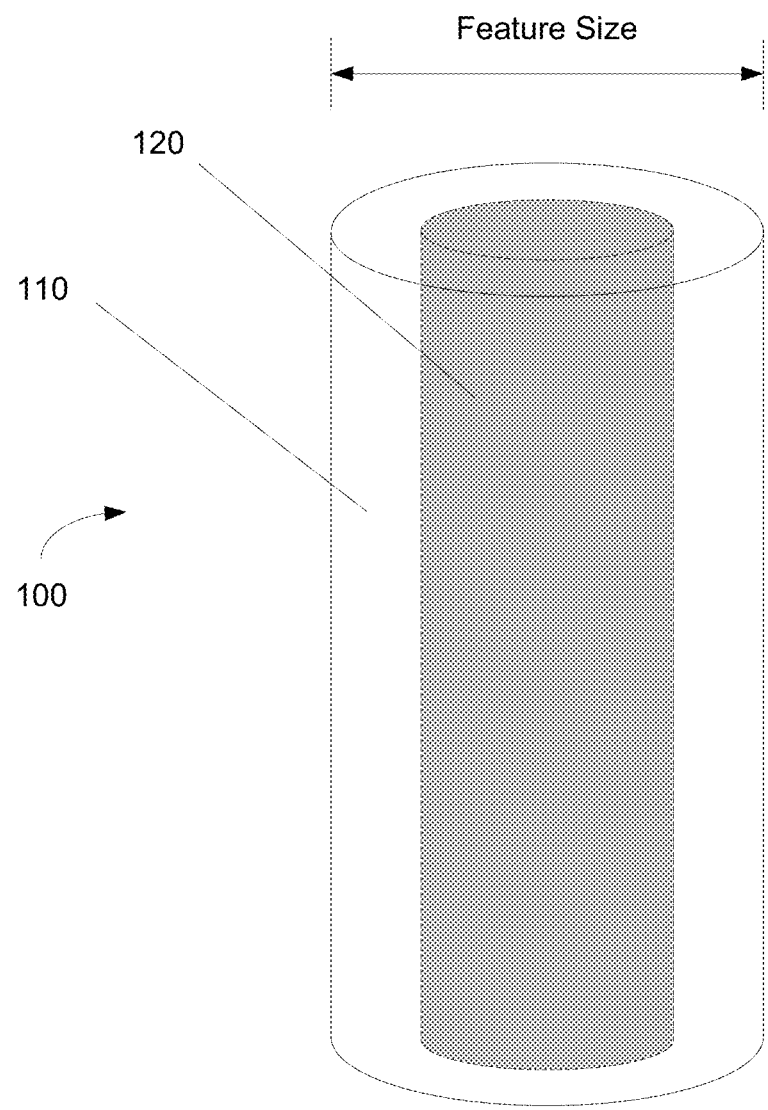
FIG. 1 is a schematic illustration of a feature filled with a tungsten nucleation and bulk layer according to certain embodiments.

FIG. 1 shows a volume occupied by a nucleation film 110 and a bulk tungsten material 120 in a via or contact structure 100 that may be formed on a substrate. Because the resistivity of the nucleation layer is higher than that of the bulk layer ($\rho_{nucleation} > \rho_{bulk}$), the thickness of the nucleation layer should be minimized to keep the total resistance as low as possible. On the other hand, the tungsten nucleation should be sufficiently thick to fully cover the underlying substrate to support high quality bulk deposition.

Features, such as via or contact holes, may be characterized by one or more of narrow and/or re-entrant openings, constrictions within the feature, and high aspect ratios. One example of a feature can include a feature hole in a substrate or a layer on the substrate, such as the feature shown in FIG. 1. The substrate may be a silicon wafer, e.g., a 200-mm wafer, a 300-mm wafer, or a 450-mm wafer, including wafers having one or more layers of material, such as dielectric, conducting, or semi-conducting material deposited thereon. The feature may be formed in one or more of these layers. In some embodiments, the feature may have an aspect ratio of at least about 2:1, at least about 4:1, at least about 6:1, at least about 10:1, or higher. The feature hole may also have a dimension near the opening, e.g., an opening diameter or line width of between about 10 nm to 500 nm, for example between about 25 nm and about 300 nm. A feature hole may be referred to as an unfilled feature or a feature.

A feature that may have a re-entrant profile may have a profile that narrows from the bottom, closed end, or interior of the feature to the feature opening. In various embodiments, the feature may have an under-layer, such as a barrier layer or adhesion layer. Non-limiting examples of under-layers include dielectric layers and conducting layers, e.g., silicon oxides, silicon nitrides, silicon carbides, metal oxides, metal nitrides, metal carbides, and metal layers. In certain embodiments, the under-layer may be titanium nitride (TiN), titanium metal (Ti), tungsten nitride (WN), titanium aluminide (TiAl), or a titanium oxide ($TiO_x$).

Features may have one or more constrictions at a midpoint within the features such that pinch off may occur during deposition of tungsten and deposited tungsten blocks further deposition past the constriction before that portion of the feature is filled. Such features may be used in logic devices, such as in a word line in a vertical NAND (VNAND) structure.

For the purposes of this description, "near the opening" is defined as an approximate position or an area within the feature (i.e., along the sidewall of the feature) corresponding to between about 0% and about 10% of the feature depth measured from the field region. In certain embodiments, the area near the opening corresponds to the area at the opening. Further, "inside the feature" is defined as an approximate position or an area within the feature corresponding to between about 20% and about 60% of the feature depth measured from the field region on the top of the feature. Typically, when values for certain parameters (e.g., thicknesses) are specified "near the opening" or "inside the feature," these values represent a measurement or an average of multiple measurements taken within these positions/areas. In certain embodiments, an average thickness of an under-layer near the opening is at least about 10% greater than that inside the feature. In more specific embodiments, this difference may be at least about 25%, at least about 50%, or at least about 100%. Distribution of a material within a feature may also be characterized by its step coverage. For the purposes of this description, "step coverage" is defined as a ratio of two thicknesses, i.e., thickness of the material inside the feature divided by the thickness of the material near the opening. In certain examples, the step coverage of the liner or other under-layer is less than about 100% or, more specifically, less than about 75% or even less than about 50%.

A tungsten nucleation layer may be deposited in a feature to conformally coat the sidewalls and bottom of the feature, or for the case of laterally oriented features having openings on both sides, the sidewalls of the feature. In general, a nucleation layer is a thin conformal layer that serves to facilitate the subsequent formation of a bulk material thereon. Conforming to the underlying feature bottom and sidewalls can be critical to support high quality deposition. Nucleation layers are often deposited using atomic layer deposition (ALD) or pulsed nucleation layer (PNL) methods.

In a PNL technique, pulses of reactant are sequentially injected and purged from the reaction chamber, typically by a pulse of a purge gas between reactants. A first reactant can be adsorbed onto the substrate, available to react with the next reactant. The process is repeated in a cyclical fashion until the desired thickness is achieved. PNL is similar to ALD techniques. PNL is generally distinguished from ALD by its higher operating pressure range (greater than 1 Torr) and its higher growth rate per cycle (greater than 1 monolayer film growth per cycle). Chamber pressure during PNL deposition may range from about 1 Torr to about 400 Torr. In the context of the description provided herein, PNL broadly embodies any cyclical process of sequentially adding reactants for reaction on a semiconductor substrate. Thus, the concept embodies techniques conventionally referred to as ALD. In the context of the disclosed embodiments, CVD embodies processes in which reactants are together introduced to a reactor for a vapor-phase reaction. PNL and ALD processes are distinct from CVD processes and vice versa.

In many instances of tungsten nucleation layer deposition, the one of the sequentially-injected reactants may be a boron-containing reducing agent (such as borane ($BH_3$) or diborane ($B_2H_6$)) or a silicon-containing reducing agent (such as silane ($SiH_4$)). However, both boron-containing reducing agents and silicon-containing reducing agents present some concerns. Use of diborane ($B_2H_6$) as a reducing agent results in thicker nucleation film deposition per cycle. This is because diborane deposition is not self-limiting. Therefore, instead of depositing a saturated monolayer on the surface, diborane may accumulate and grow on the surface of the feature, thereby yielding more diborane on the surface. The thicker layer of diborane results in a thicker nucleation layer of tungsten when the tungsten-containing precursor reacts with the diborane. Thus, when using diborane, tungsten nucleation films are often deposited at a thickness of about 4 Å to about 12 Å per cycle.

In some cases, nucleation layer deposition is followed by a post-deposition treatment to improve resistivity, such as treating the nucleation layer with sequential pulses of a boron-containing reducing agent such as diborane ($B_2H_6$). Another alternative is to expose the nucleation layer to alternate pulses of diborane and tungsten hexafluoride ($WF_6$). Although diborane-treated nucleation layers may have lower resistivity, potential issues still arise due to the presence of boron-10 ($^{10}B$), an isotope of boron, in the bulk tungsten film.

Presence of boron-10 causes integration issues, such as processing defects during chemical mechanical planarization (CMP), or soft error rate defects due to interaction of isotope boron-10 with thermal neutrons. Specifically, boron-10 reacts with chemicals during CMP to form soluble boric acid, which leads to edge erosion, plug pull out, and other defects. These defects are of particular concern for deposited tungsten films in logic devices.

Figure 2A:
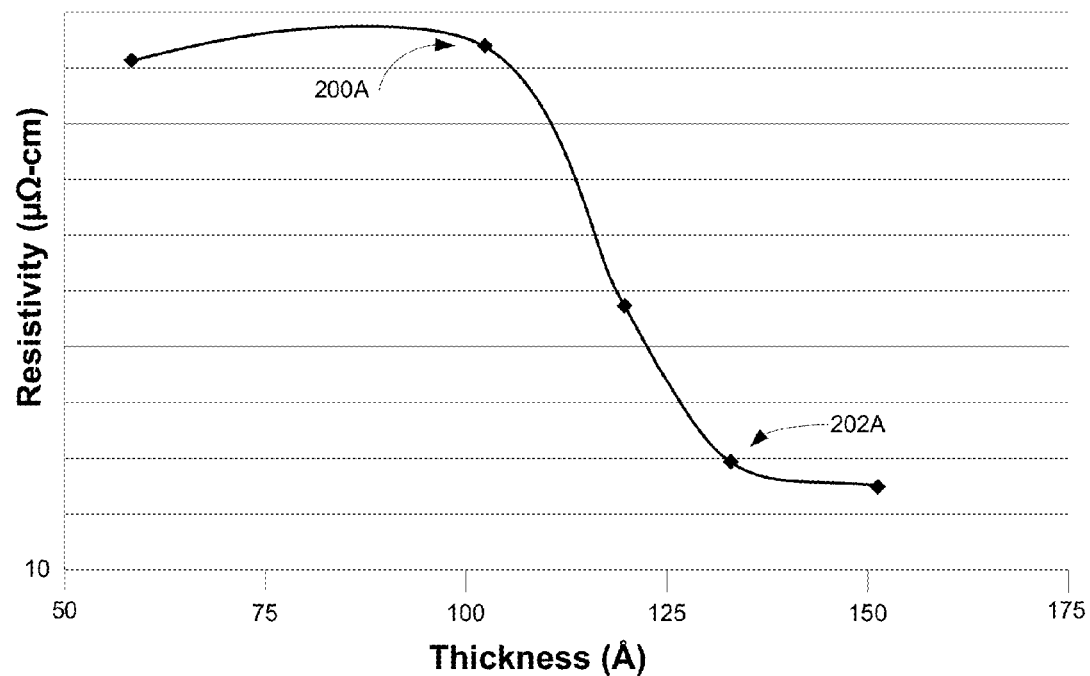
FIGS. 2A and 2B are plots illustrating the presence of beta-tungsten versus alpha-tungsten in various embodiments.

Another concern in using boron-containing reducing agents may be its effect on the type of tungsten that forms in the feature. FIG. 2A is a plot depicting resistivity of tungsten films deposited using diborane and tungsten hexafluoride pulses for the nucleation layer deposition, followed by diborane pulses for post-deposition treatment, and lastly bulk CVD tungsten deposition. Points 200A and 202A represent the resistivity of tungsten films of about 105 Å and 130 Å, respectively, deposited using this method with bulk CVD tungsten deposited at 300° C. The y-axis represents the resistivity of the overall deposited tungsten including both the nucleation layer and the bulk CVD tungsten, and the x-axis represents the thickness of the entire tungsten deposition including both the nucleation layer and the bulk CVD tungsten. As shown, there is a slight increase in the resistivity curve for boron-based tungsten film depositions prior to the resistivity decreasing with thickness. Note the lower resistivity of the tungsten film at point 202A. It should be noted that the resistivity curve characteristics may also depend on the CVD process employed; a boron-based nucleation layer followed by CVD at 395° C. did not show the same rise in resistivity as thickness increased.

Figure 2B:
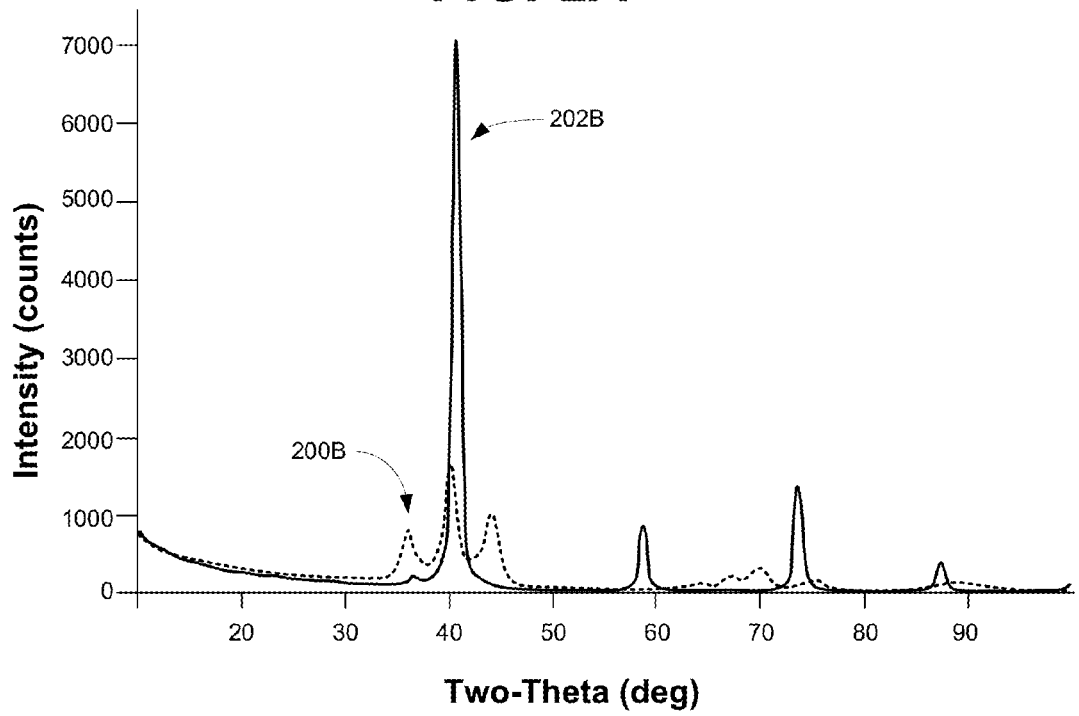

The tungsten films represented by points 200A and 202A were evaluated using x-ray diffraction. The film represented by point 200A in FIG. 2A shows a peak 200B in FIG. 2B corresponding to presence of beta-tungsten (β-W). The film represented by point 202A shows a peak 202B corresponding to the high presence of alpha-tungsten (α-W). This data indicates that the presence of beta-tungsten increases the resistivity of the overall tungsten film. Beta-tungsten has a metastable A15 cubic crystalline structure and exhibits higher resistivity than the stable body-centered cubic crystalline structure of alpha-tungsten. Without being bound by a particular theory it is believed that boron-based nucleation layers may lead to the presence of higher resistivity beta-tungsten in tungsten films at certain thicknesses. As discussed further below, tungsten films deposited on top of germanium-based nucleation layers do not exhibit the resistivity behavior shown in FIG. 2A; rather the resistivity decreases with increasing thickness.

It is desirable for nucleation layers to form a good surface for bulk tungsten deposition. Silane ($SiH_4$) has been used in nucleation layer deposition as an alternative to boron-containing reducing agents. However, for silane-based nucleation layers to yield good bulk tungsten growth, a thicker layer of the tungsten nucleation layer is typically needed, such as a layer at least greater than 50 Å thick. Since the resistivity of a tungsten nucleation layer is higher, this results in an overall higher resistivity tungsten film. The lack of granularity in the thickness per cycle also results in reduced process control.

Provided herein are methods of filling features with tungsten and related systems and apparatuses. Examples of application include logic and memory contact fill, DRAM buried word line fill, vertically integrated memory gate/word line fill, and 3-D integration with through-silicon vias (TSVs). The methods described herein can be used to fill vertical features, such as in tungsten vias, and horizontal features, such as VNAND word lines. The methods may be used for conformal and bottom-up or inside-out fill.

It has been found that tungsten films deposited using germanium-containing reducing agents can provide low resistivity, thin tungsten nucleation films that yield alpha-tungsten growth, with the resulting films causing has little or no defects in logic devices. In particular, tungsten nucleation film deposition using germanium-containing reducing agents deposits thinner films per cycle, thereby lowering resistivity and providing finer control over the resulting thickness of the nucleation film. These thin nucleation layers also promote good tungsten growth for deposition of the tungsten bulk layer. Moreover, when a tungsten-containing precursor reacts with the germanium-containing deposited film in each cycle, the amount of germanium-containing deposited film left on the substrate as measured by x-ray photoelectron spectroscopy is little, suggesting that most of the film in the feature is reduced to elemental tungsten.

Figure 3:
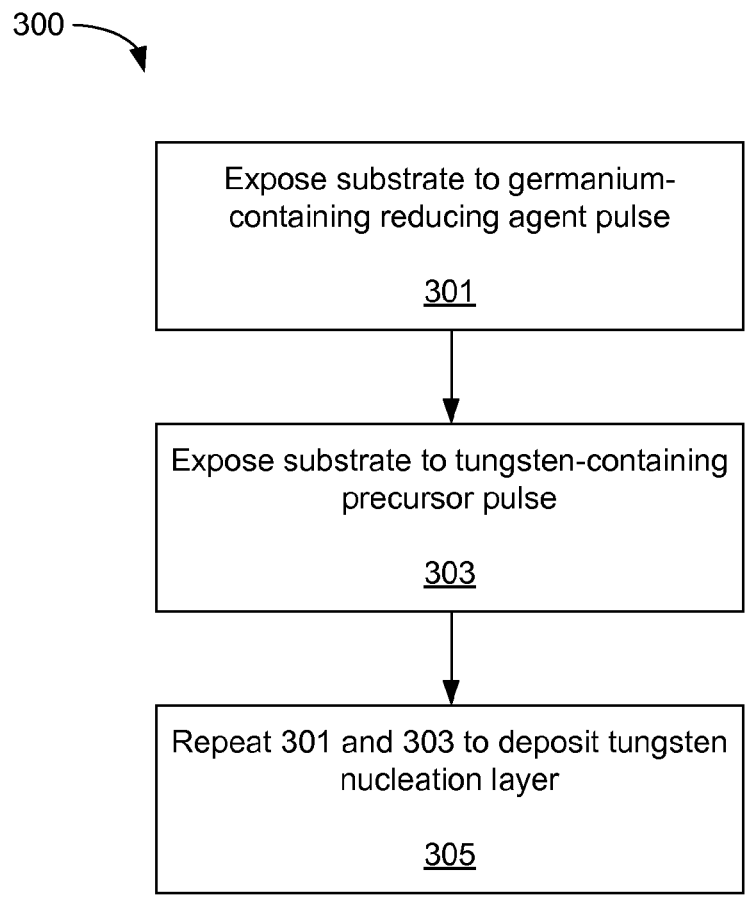
FIG. 3 is a process flow diagram illustrating operations in a method of filling a feature with tungsten according to various embodiments.

FIG. 3 is a process flow diagram of a method for filling features with tungsten in accordance with various embodiments. In some embodiments, method 300 may be performed at a temperature between about 200° C. and about 400° C. In some embodiments, method 300 may be performed at a pressure between about 1 Torr and about 300 Torr. Temperatures and pressures outside these ranges may be used according to particular implementations. In operation 301, a substrate is exposed to a pulse of a germanium-containing reducing agent. As an example, the substrate may be a substrate one or more features to be filled with tungsten. According to various embodiments, the substrate feature has an aspect ratio of at least 10:1, at least 15:1, at least 20:1, at least 25:1 or at least 30:1. Also according to various embodiments, the feature size is characterized by the feature opening size in addition to or instead of the aspect ratio. The opening may be from 10 nm to 100 nm, or 10 nm to 50 nm wide. For example, in certain embodiments, the methods may be advantageously used with features having narrow openings, regardless of the aspect ratio. In certain embodiments, the recessed feature is formed within a dielectric layer on a substrate, with the bottom of the feature providing contact to an underlying metal layer. Also in certain embodiments, the feature includes a liner/barrier layer on its sidewalls and/or bottom. Examples of liner layers include Ti/TiN, TiN and WN. In addition to or instead of diffusion barrier layers, the feature may include layers such as an adhesion layer, a nucleation layer, a combination of thereof, or any other applicable material lining the sidewalls and bottom of the feature. In certain embodiments, the feature is a re-entrant feature; that is the liner layer or other material forms an overhang that partially blocks the feature opening.

Any germanium-containing compound that can decompose or react to form a layer capable of reducing the tungsten-containing precursor to form elemental tungsten may be used. Examples include germanes, such as $Ge_nH_{n+4}$, $Ge_nH_{n+6}$, $Ge_nH_{n+8}$, and $Ge_nH_m$, where n is an integer from 1 to 10, and n is a different integer than m. Other germanium-containing compounds may also be used, e.g., alkyl germanes, alkyl germanium, aminogermanes, carbogermanes, and halogermanes. In general, halogermanes may not have significant reducing potential but there may be process conditions and tungsten-containing precursors suitable for film formation using halogermanes.

Example pulse times can be between about 0.25 seconds and about 30 seconds, about 0.25 seconds to about 5 seconds, or about 0.5 seconds to about 3 seconds. The pulse may be sufficient to saturate the surface of the features in the substrate. In some embodiments, the pulse may be sufficient to oversaturate the surface of the features in the substrate. In some embodiments, a carrier gas may be used, such as, for example, argon (Ar), helium (He), or nitrogen ($N_2$).

In various embodiments, operation 301 may be performed in a hydrogen environment. For example, hydrogen may be flowed to a chamber where the substrate is processed at a hydrogen-to-germanium-containing reducing agent ratio of at least 10:1, or at least 50:1, or at least 70:1, or at least 100:1. As discussed further below, deposition in a hydrogen environment may decrease the thickness deposited per cycle, as well as decrease the resistivity of the deposited tungsten film.

After operation 301, there may be an optional purge step to purge excess germanium-containing reducing agent still in gas phase that did not adsorb to the surface of the feature. A purge may be conducted by flowing an inert gas at a fixed pressure thereby reducing the pressure of the chamber and re-pressurizing the chamber before initiating another gas exposure.

Next, in operation 303, the substrate is exposed to a tungsten-containing precursor pulse. The tungsten-containing precursor reacts with the deposited layer of germanium to form elemental tungsten. Examples of tungsten-containing precursors include tungsten hexafluoride ($WF_6$), tungsten hexachloride ($WCl_6$), or tungsten hexacarbonyl ($W(CO)_6$). In some embodiments, the tungsten-containing precursor is a halogen-containing compound, such as tungsten hexafluoride. Organo-metallic precursors and precursors that are free of fluorine, such as MDNOW (methylcyclopentadienyl-dicarbonylnitrosyl-tungsten) and EDNOW (ethylcyclopentadienyl-dicarbonylnitrosyl-tungsten) may also be used.

In some embodiments, the tungsten-containing gas precursor exposure includes a carrier gas, such as nitrogen ($N_2$), argon (Ar), helium (He), hydrogen ($H_2$), or other inert gases.

Example pulse times can be between about 0.25 seconds and about 30 seconds, about 0.25 seconds to about 5 seconds, or about 0.5 seconds to about 3 seconds. The pulse may be sufficient to react with the reactive sites on the surface of the feature of the substrate where germanium adsorbed onto the surface.

In some embodiments, both operations 301 and 303 may be performed in a hydrogen environment. After operation 303, there may be an optional purge step to purge excess tungsten-containing precursor in the gas phase.

In operation 305, operations 301 and 303 are repeated until a desired thickness of a tungsten nucleation layer is deposited on the surface of the feature. Each repetition of operations 301 and 303 may be referred to as a "cycle." In some embodiments, method 300 may yield low resistivity tungsten nucleation layers without subsequent treatment. In some embodiments, the order of operations 301 and 303 may be reversed, such that tungsten-containing precursor is pulsed first.

In many embodiments, the deposition of a tungsten nucleation layer will involve pulses of one or more germanium-containing compounds as the only reducing agent pulses, without any pulses of boron-containing reducing agents, silicon-containing reducing agents, or other reducing agents. However, in some embodiments, pulses of one or more additional reducing agents, such as boron-containing or silicon-containing reducing agent pulses, may be used. In these embodiments, the additional reducing agents may be pulsed sequentially or simultaneously with the germanium-containing reducing agent. In this context, it is noted that while hydrogen can be a reducing agent, it is not believed to function as a reducing agent in the nucleation process of FIG. 3 when that is run in a hydrogen environment.

In various embodiments, the amount of tungsten deposited per cycle may be at least about 2 Å, or between about 2 Å and about 8 Å, or less than about 12 Å. As compared to conventional ALD processes, this lower tungsten thickness deposited per cycle allows fine-tuning of the deposition process and overall lower resistivity of the tungsten in the feature. The ability to deposit tungsten nucleation layers with a thickness of between 2 Å and 8 Å allows dialing in of a desire thickness. The tungsten nucleation layer may be deposited to any appropriate thickness. As discussed above, in general, it is advantageous to keep the nucleation layer as thin as possible while still promoting good bulk growth.

As a result, the deposited tungsten nucleation layer may have a thickness less than about 1 nm, or between about 1 nm and about 20 nm, depending on the feature. In various embodiments, the thickness of the tungsten nucleation layer may be between about 1 nm and about 10 nm.

After method 300 is performed, a bulk tungsten layer may be deposited on the tungsten nucleation layer. As an example, the total thickness of the deposited germane-based tungsten nucleation layer and bulk tungsten layer may be between about 1 nm and about 200 nm, or between about 4 nm and about 200 nm, or between about 10 nm and about 50 nm, or between about 1 nm and about 10 nm. Methods of depositing the bulk tungsten film may include CVD, plasma enhanced CVD (PECVD), and physical vapor deposition (PVD). In various embodiments, tungsten grain growth on the nucleation layer deposited using a germanium-containing reducing agent may grow from a first reactive site on the surface of the substrate to the grain growth at a second reactive site on the surface of the substrate. These reactive sites may be where tungsten nucleated during operation 303. In some embodiments, these grains may grow horizontally across the width of the feature from one sidewall to another.

Without being bound by a particular theory, it is believed that use of a germanium-containing reducing agent results in formation of metallic, microcrystalline alpha-tungsten (α-W), rather than beta-tungsten (β-W). As discussed above, alpha-tungsten is the stable, crystalline structure of elemental tungsten and has a lower resistivity than beta-tungsten, which is a metastable structure. The formation of the nucleation layer using a germanium-containing reducing agent promotes alpha-tungsten growth during bulk deposition, thereby reducing resistivity overall. The presence of alpha-tungsten versus beta-tungsten may be measured by x-ray diffraction analysis or other suitable methods. The method 300 therefore may be performed such that the tungsten nucleation layer and the subsequent bulk tungsten deposited in the feature is at least 90% alpha-tungsten or at least 99% alpha-tungsten.

Figure 4A:
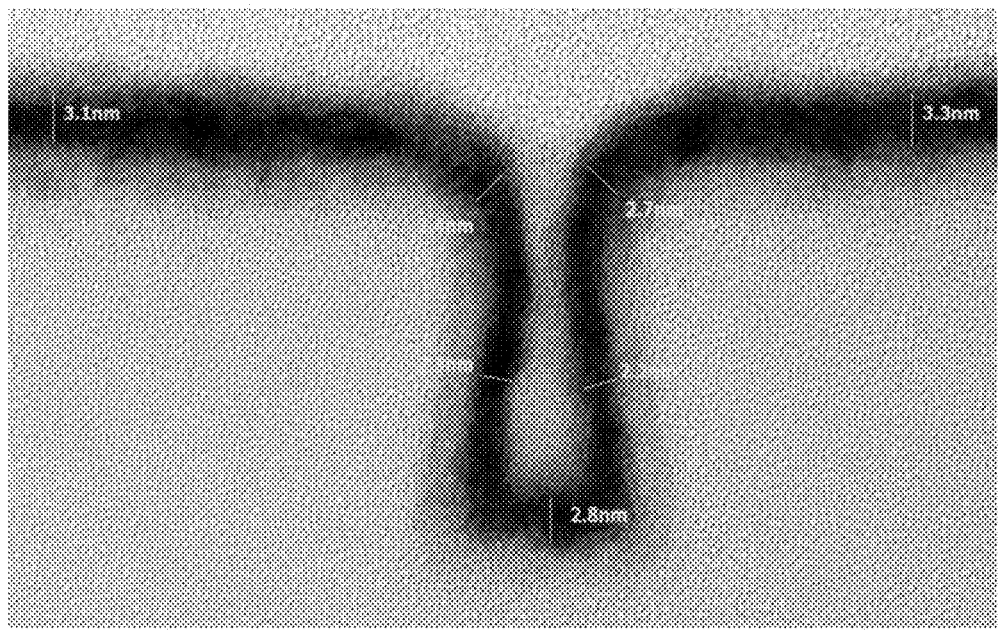
FIG. 4A is an example of an image of a feature with a deposited tungsten nucleation layer according to various embodiments.
Figure 4B:
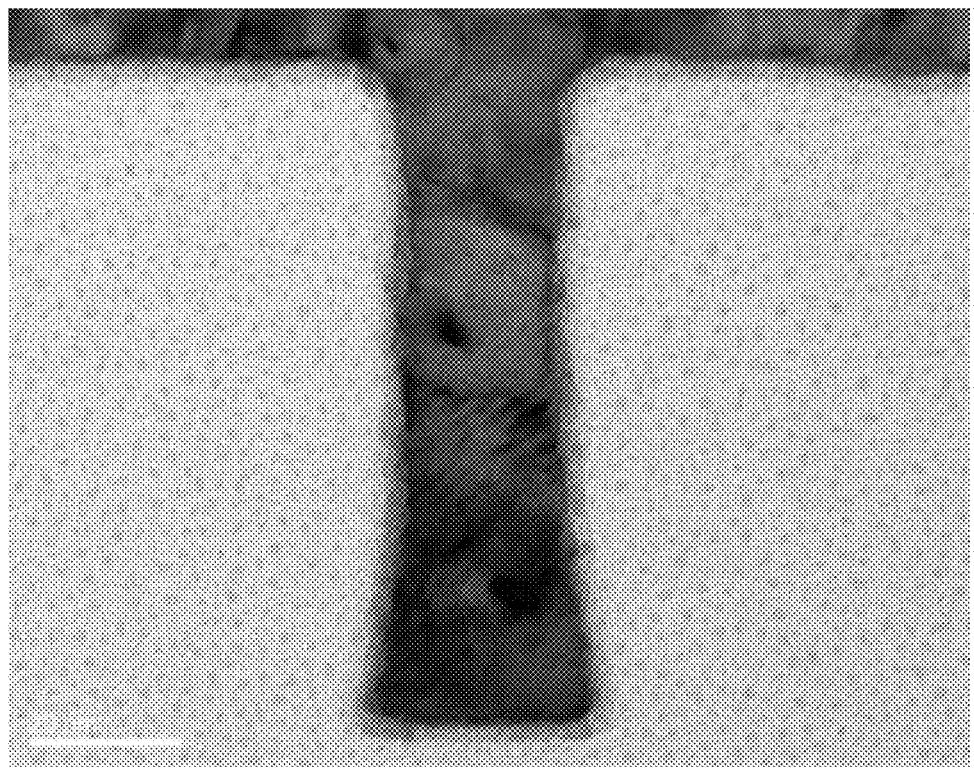
FIG. 4B is an example of an image of a feature with a deposited tungsten nucleation layer and tungsten bulk layer according to various embodiments.

An example of a deposited tungsten nucleation layer is shown in FIG. 4A. FIG. 4A is transmission electron microscopy (TEM) image of a deposited tungsten layer in a feature having a 20 nm width. The step coverage for the deposited tungsten was about 85% at the bottom, about 70% on the sidewalls, and about 82% at the opening of the feature. This shows good step coverage for nucleation layers deposited using germanium-containing reducing agents. The deposited nucleation layer has a thickness between about 20 Å and about 30 Å. FIG. 4B shows a feature with deposited tungsten bulk layer on a nucleation layer deposited using germane. As shown, the deposited tungsten bulk layer has excellent large grain fill and the nucleation layer itself is very thin and visually indistinguishable from the bulk tungsten layer. This may indicate less of a grain boundary and hence less resistance.

Also the TEM image shows an absence of a seam down the middle of the deposited tungsten film in the feature. This may be due to grains growing from one sidewall of the feature to another. Alternatively, tungsten growth may be extending from one site where tungsten nucleated on the surface of the feature to another site where tungsten nucleated on the surface.

Figure 5:
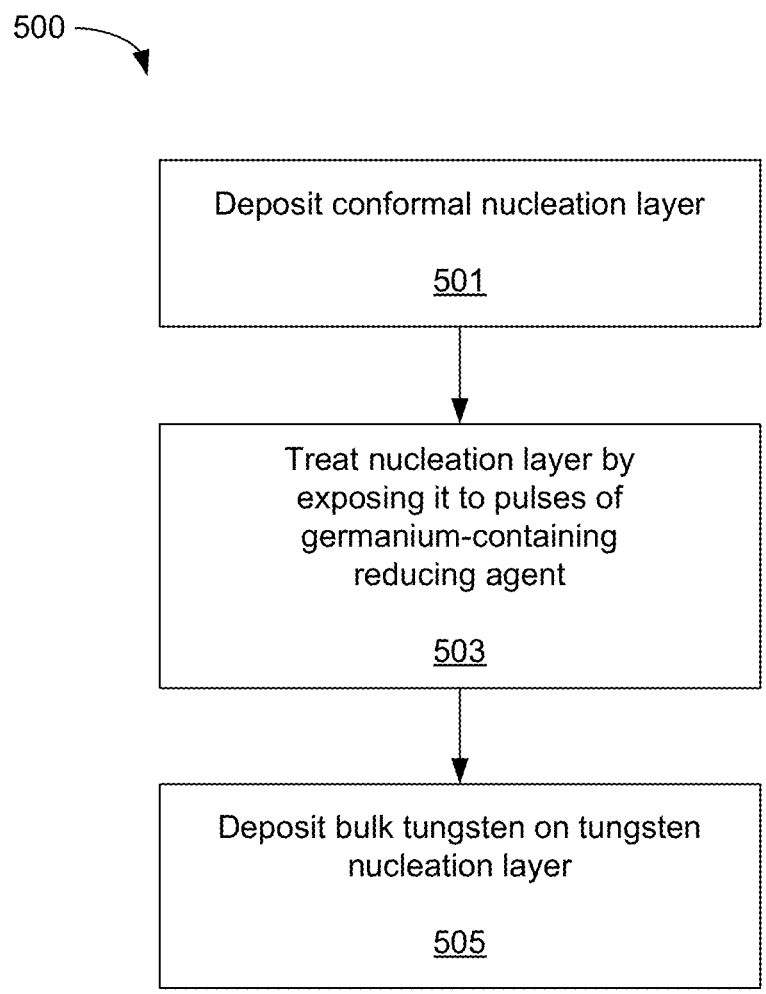
FIG. 5 is a process flow diagram illustrating operations in a method of filling a feature with tungsten according to various embodiments.

FIG. 5 is a process flow diagram for a method 500 of filling tungsten in a feature of a substrate. As an example, the substrate may be a substrate having features, such as a feature with an aspect ratio of at least 6:1, or at least 10:1, or at least 20:1. In some embodiments, method 500 may be performed at a temperature between about 200° C. and about 400° C. In some embodiments, method 500 may be performed at a pressure between about 1 Torr and about 300 Torr. Temperatures and pressures outside these ranges may be used according to particular implementations.

In operation 501, a conformal nucleation layer is deposited in the feature. This may be deposited prior to any fill of the feature. This may be performed by any suitable method for depositing a nucleation layer, such as ALD, PNL, plasma-enhanced ALD (PEALD), or CVD. In many embodiments, the reducing agent used to deposit the nucleation layer is a germanium-containing reducing agent. In other embodiments, the reducing agent used to deposit the nucleation layer may include boron-containing reducing agents including diborane ($B_2H_6$) and other boranes, silicon-containing reducing agents including silane ($SiH_4$) and other silanes, hydrazines, and germanes. In some embodiments, the method of depositing a nucleation layer may be a method as described above with respect to FIG. 3.

Next, in operation 503, the nucleation layer is treated by exposing it to pulses of a germanium-containing reducing agent. Examples of a germanium-containing reducing agent include germane ($GeH_4$) and digermane ($Ge_2H_6$), and any of those described above with respect to operation 301 in FIG. 3.

In various embodiments, operation 503 may be performed without any intervening pulses of any other precursors. Example pulse times of germanium-containing reducing agent may be between about 0.25 seconds and about 20 seconds, or 0.25 seconds and 5 seconds.

Figure 6A:
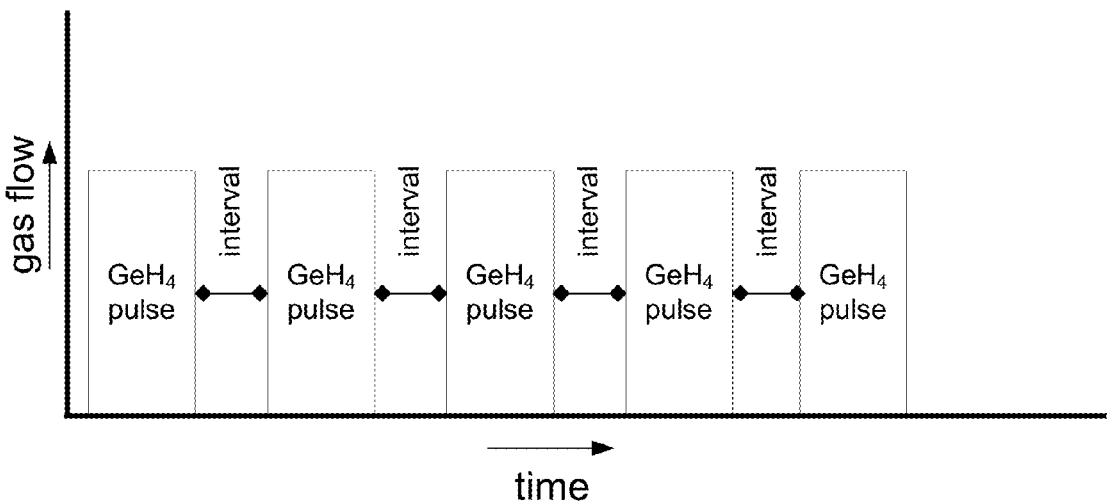
FIGS. 6A and 6B illustrate gas pulse sequences in a low resistivity treatment according to various embodiments.

One example of this pulsing scheme without intervening pulses is represented by the schematic illustration in FIG. 6A. The figure shows an example of a scheme using pulses of germane ($GeH_4$) over time. As shown, gas flow of each pulse of germane is separated by a time interval. Example time interval pauses between pulses may be between about 0.5 seconds about 5 seconds.

Referring back to FIG. 5, in some embodiments of operation 503, the treatment may be performed with intervening pulses of a tungsten-containing precursor. Examples of tungsten-containing precursors include tungsten hexafluoride ($WF_6$) and tungsten hexachloride ($WCl_6$), and any of those described above with respect to operation 303 in FIG. 3.

Figure 6B:
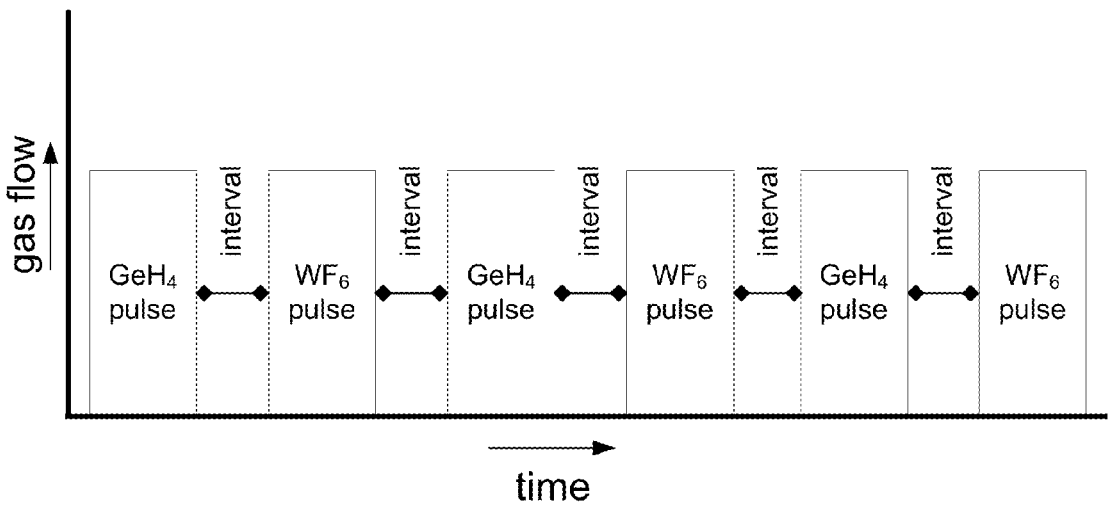

One example of this pulsing scheme with intervening pulses is represented by the schematic illustration in FIG. 6B. The figure shows an example of the scheme using germane ($GeH_4$) and tungsten hexafluoride ($WF_6$), each pulse separated by a time interval.

In some embodiments, the amount of tungsten-containing precursor pulsed during operation 503 in the intervening tungsten-containing precursor pulses may be less than the tungsten-containing precursor pulsed in operation 501. In some embodiments, there may be substantially no tungsten deposited during operation 503 with intervening tungsten-containing precursor pulses, e.g., less than a monolayer is deposited. For example, the pulses of tungsten-containing precursor may be short in duration such that no tungsten adsorbs onto the surface of the tungsten nucleation layer during operation 503. If a germanium-containing reducing agent is used in depositing the nucleation layer, prior to treating it as illustrated in FIG. 6B, transitioning from cycles of the germanium-containing reducing agent/tungsten-containing precursor during nucleation layer deposition to cycles of the germanium-containing reducing agent/tungsten-containing precursor may involve reducing the total amount of tungsten-containing precursor introduced during a pulse, e.g., by shortening a pulse time and/or reducing a flow rate. In various embodiments, operation 503 may be performed in a hydrogen or hydrogen-free environment.

Referring back to FIG. 5, after the nucleation layer is treated, in operation 505, bulk tungsten film is deposited on the tungsten nucleation layer. Methods of depositing the bulk tungsten film may include CVD, PECVD, and PVD.

CVD deposition of a bulk layer can involve flowing a tungsten-containing precursor and a co-reactant such as a reducing agent, if appropriate, into a deposition chamber. An inert carrier gas may be used to deliver one or more of the reactant streams, which may or may not be pre-mixed. Unlike PNL or ALD processes, this operation generally involves flowing the reactants continuously until the desired amount is deposited. In certain embodiments, the CVD operation may take place in multiple stages, with multiple periods of continuous and simultaneous flow of reactants separated by periods of one or more diverted reactant flows. Flows may also be pulsed for a pulse time between about 1 second and about 2 seconds. Example ranges of chamber pressure during CVD deposition may range from about 10 Torr to about 500 Torr.

Example substrate temperatures are as low as 250° C. and may be as high as 495° C. during the CVD reaction. Various tungsten-containing gases including, but not limited to, $WF_6$, tungsten chloride ($WCl_6$), and tungsten hexacarbonyl ($W(CO)_6$), can be used as the tungsten-containing precursor. In certain embodiments, the tungsten-containing precursor is a halogen-containing compound, such as $WF_6$. In certain embodiments, the reducing agent is hydrogen gas, though other reducing agents may be used, including silane ($SiH_4$), disilane ($Si_2H_6$), hydrazine ($N_2H_4$), diborane ($B_2H_6$), and germane ($GeH_4$). In some embodiments, CVD may be implemented in various stages, such as a low temperature stage and a high temperature stage. Still further, nitrogen may be pulsed during CVD deposition of a bulk layer as described in U.S. Pat. No. 8,551,885 and U.S. patent application Ser. No. 13/633,798, both of which are incorporated by reference herein.

Figure 6C:
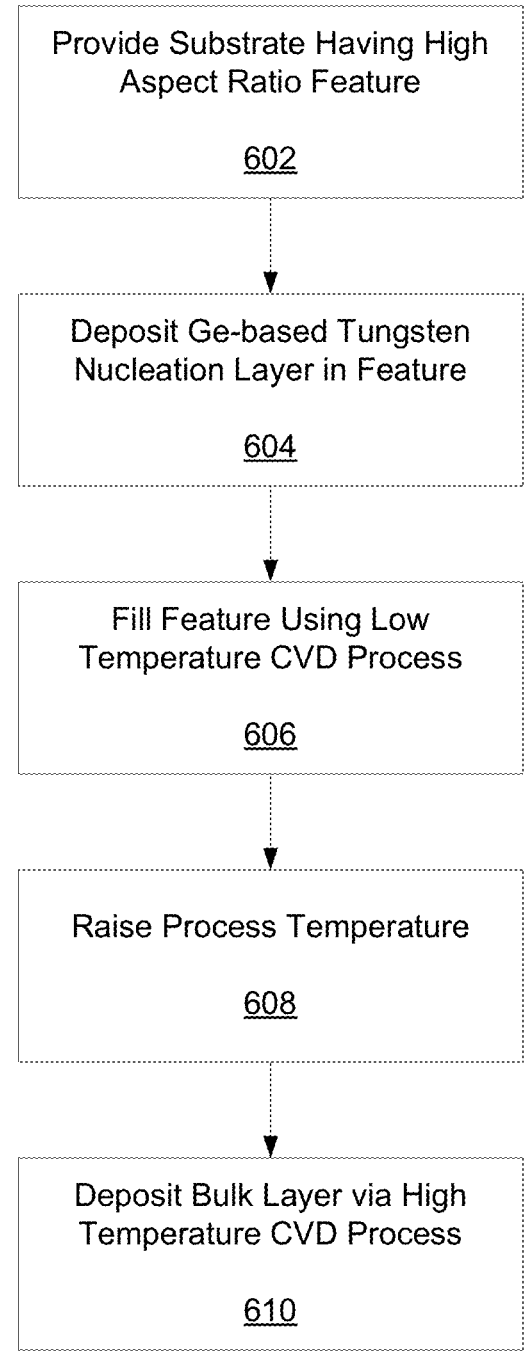
FIG. 6C is a process flow diagram illustrating operations in a method of filling a feature with tungsten according to various embodiments.

FIG. 6C presents a process flow diagram illustrating operations in a method of providing fill according to certain embodiments. The process begins by providing a substrate having a high aspect ratio feature formed therein (602). A germanium-based tungsten nucleation layer is then deposited in the feature as described above, typically to conformally coat the sidewalls and bottom of the feature (604). Examples of nucleation thicknesses range from less than about 1 nm to about 20 nm.

In certain embodiments, depositing the nucleation layer is followed by a post-deposition treatment operation to improve resistivity. Such treatment operations are in U.S. Patent Publication No. 2009/0149022, and U.S. patent application Ser. No. 12/407,541, both of which are incorporated by reference herein, and above with respect to FIGS. 6A and 6B. In some embodiments, operations 604 and a post-deposition treatment operation may be boron-free.

Once the nucleation layer is formed, the process continues by filling the feature with a low-temperature CVD tungsten film (606). In this operation, a reducing agent and a tungsten-containing precursor are flowed into a deposition chamber to deposit a bulk fill layer in the feature. An inert carrier gas may be used to deliver one or more of the reactant streams, which may or may not be pre-mixed. Unlike PNL or ALD processes, this operation generally involves flowing the reactants continuously until the desired amount is deposited. In certain embodiments, the CVD operation may take place in multiple stages, with multiple periods of continuous and simultaneous flow of reactants separated by periods of one or more reactant flows diverted.

The reduced temperature CVD operation used to fill the feature can be used with thinner nucleation layers than required by conventional higher temperature CVD. Without being bound by any particular theory, it is believed that this may be because the slower chemistry at the reduced temperatures improves growth even on nucleation sites that are not fully developed. According to various embodiments, nucleation layers of between about 10 Å and about 200 Å may be formed; in certain embodiments, nucleation layers may have a thickness less than about 10 Å.

Various tungsten-containing gases including, but not limited to, $WF_6$, $WCl_6$, and $W(CO)_6$ can be used as the tungsten-containing precursor. In certain embodiments, the tungsten-containing precursor is a halogen-containing compound, such as $WF_6$. In certain embodiments, the reducing agent is hydrogen gas, though other reducing agents may be used including silane ($SiH_4$), disilane ($Si_2H_6$) hydrazine ($N_2H_4$), diborane ($B_2H_6$) and germane ($GeH_4$). In many embodiments, hydrogen gas is used as the reducing agent in the CVD process.

CVD filling of the feature is performed at a reduced temperature. According to various embodiments, the reduced temperature (process and/or substrate temperature) is in one of the following ranges: between about 250° C.-350° C., between about 250° C.-340° C., between about 250° C.-360° C., between about 250° C.-325° C., between about 250° C.-320° C., between about 250° C.-315° C., between about 250° C.-310° C., between about 250° C.-305° C., or between about 250° C.-300° C. Also according to various embodiments, the process and/or substrate temperature is: between about 260-310° C., between about 270° C.-310° C., between about 280° C.-310° C., or between about 290° C.-310° C. In certain embodiments, the process and/or substrate temperature is about 300° C.

It should be noted that in some embodiments, a germanium-based nucleation layer may be advantageous for low-temperature CVD fill. This is because, as described above with respect to FIGS. 2A and 2B, low-temperature CVD fill on a boron-based nucleation layer may exhibit a rise in resistivity with increasing thickness for certain thicknesses of interest.

After filling the feature, the temperature may be raised to deposit a high temperature CVD layer (608). The high temperature may be in one of the following ranges: between about 350° C.-450° C., between about 360° C.-450° C., between about 370° C.-450° C., between about 380° C.-450° C., between about 390° C.-450° C., or between about 400° C.-450° C. In certain embodiments, the high temperature CVD is performed at about 395° C. Raising the temperature may involve raising the substrate temperature. According to various embodiments, the temperature is raised at least about 50° C., at least about 60° C., at least about 70° C., at least about 80° C., at least about 90° C., at least about 100° C., or at least about 110° C. The high temperature CVD layer is then deposited (610). In certain embodiments, operations 608 and 610 are not performed; that is, after the low temperature CVD process is complete and the feature is filled, the substrate moves on for further processing such as planarization.

In certain embodiments, transitioning from operation 606 to operation 608 involves moving the substrate from one deposition station to another in a multi-station chamber. Still further, each of operation 604, the post-deposition resistivity treatment (if performed), operation 606 and operation 608 is performed in a different station of the same multi-station chamber.

In alternative embodiments in which a single station is used to perform operations 606 and 608, transitioning from operation 606 to operation 608 involved shutting off a flow of tungsten precursor (optionally allowing hydrogen or other reducing gas and/or carrier gas to run), while raising the substrate temperature. Once the substrate temperature is stabilized, the tungsten precursor and other gases, if necessary, are flowed into the reaction chamber for the high temperature deposition. In other embodiments, transitioning from operation 606 may involve raising the substrate temperature while allowing the deposition to continue during the transition period. In embodiments in which the high temperature tungsten CVD film is deposited, it may be deposited as an overburden layer on the filled feature.

Figure 6D:
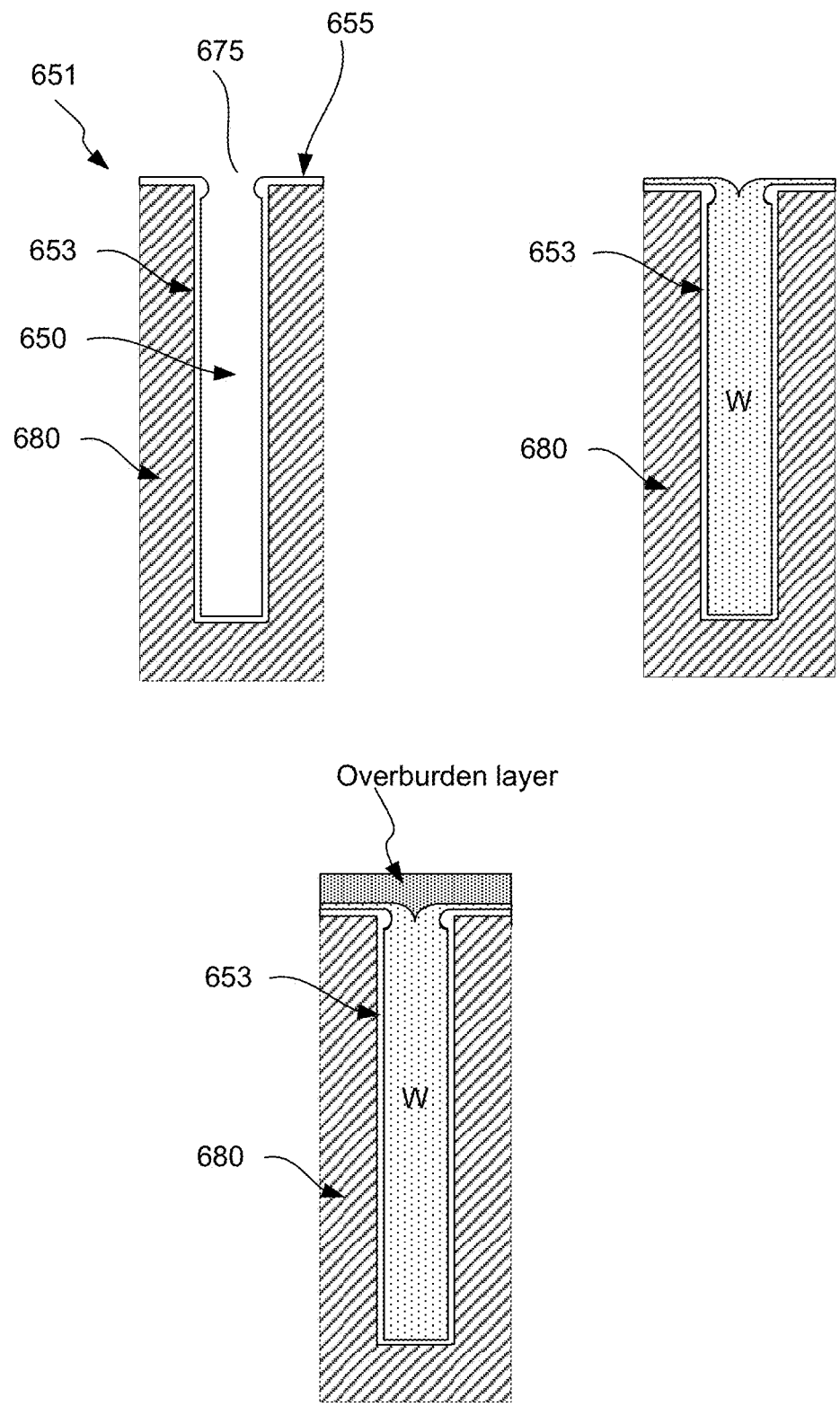
FIG. 6D is a schematic illustration of feature cross-sections at various stages of a process according to certain embodiments.

FIG. 6D illustrates schematic representations of one example of a feature's cross-sections at different stages of a filling process in which a high temperature CVD layer is deposited after the feature 650 is filled using reduced temperature CVD. Cross-section 651 represents an example of the feature 650 prior to any tungsten deposition. In this example, the feature 650 is formed in a dielectric layer 680, has an opening 675 at the top surface 655 of the substrate and includes a liner layer 653, such as TiN layer.

APPARATUS

Any suitable chamber may be used to implement the disclosed embodiments. Example deposition apparatuses include various systems, e.g., ALTUS® and ALTUS® Max, available from Lam Research Corp., of Fremont, Calif., or any of a variety of other commercially available processing systems. In some embodiments, the pulsed nucleation process is performed at a first station that is one of two, five or even more deposition stations positioned within a single deposition chamber. Thus, the reducing gases and the tungsten-containing gases are alternately introduced to the surface of the semiconductor substrate, at the first station, using an individual gas supply system that creates a localized atmosphere at the substrate surface. Another station may be used to for a treatment operation as described above. One or more stations can then be used to perform chemical vapor deposition (CVD) as described above. Two or more stations may be used to perform CVD in a parallel processing. Alternatively a wafer may be indexed to have the CVD operations performed over two or more stations sequentially.

Figure 7:
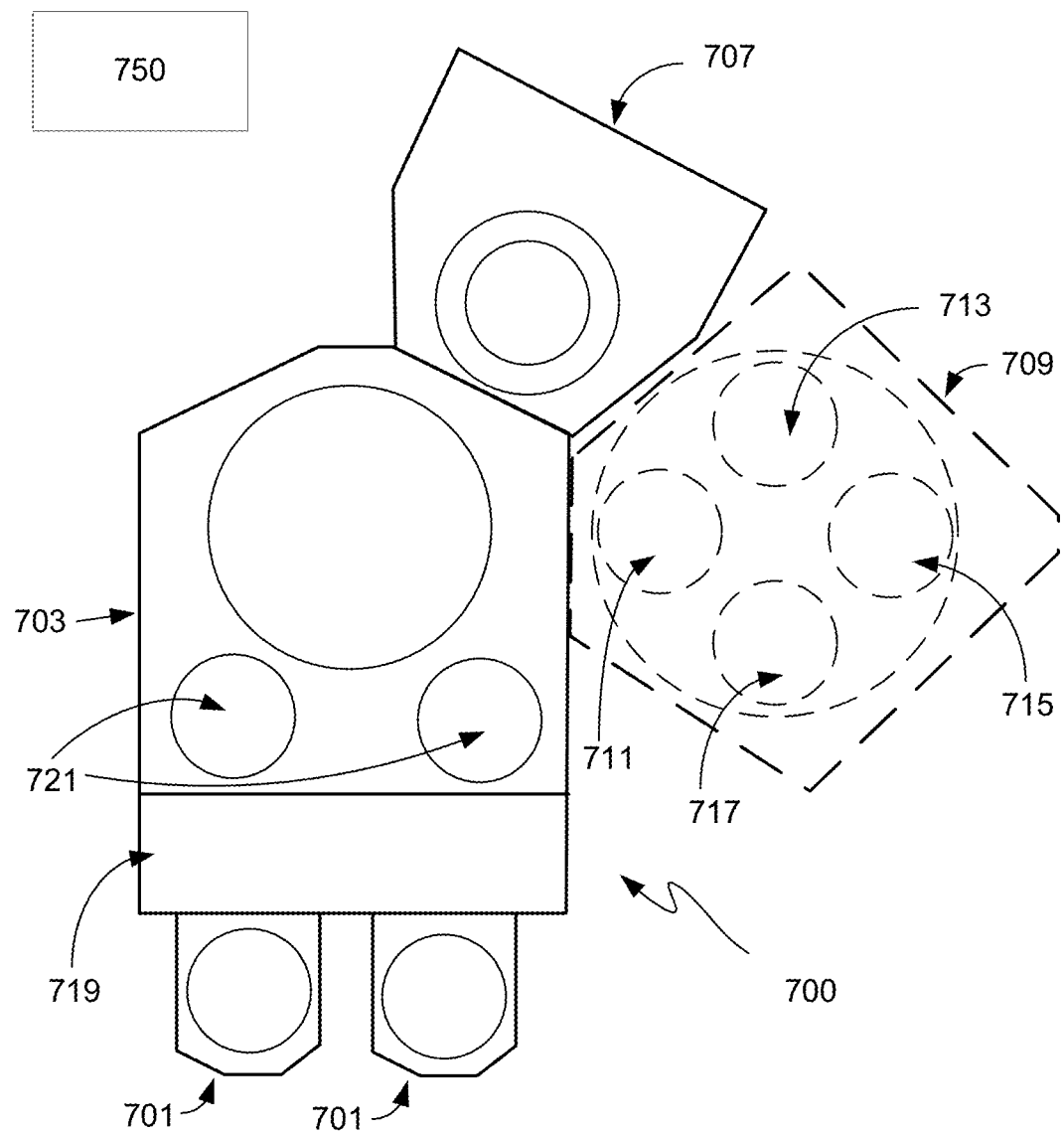
FIG. 7 is a schematic illustration of a processing system suitable for conducting tungsten deposition processes in accordance with disclosed embodiments.

FIG. 7 is a block diagram of a processing system suitable for conducting tungsten thin film deposition processes in accordance with embodiments. The system 700 includes a transfer module 703. The transfer module 703 provides a clean, pressurized environment to minimize risk of contamination of substrates being processed as they are moved between various reactor modules. Mounted on the transfer module 703 is a multi-station reactor 709 capable of performing pulsed nucleation layer (PNL) deposition, multi-pulse treatment if desired, and CVD according to embodiments. Chamber 709 may include multiple stations 711, 713, 715, and 717 that may sequentially perform these operations. For example, chamber 709 could be configured such that station 711 performs germane-based PNL deposition, station 713 performs multi-pulse treatment, and stations 715 and 717 can perform CVD. Stations may include a heated pedestal or substrate support, one or more gas inlets or showerhead or dispersion plate.

Also mounted on the transfer module 703 may be one or more single or multi-station modules 707 capable of performing plasma or chemical (non-plasma) pre-cleans. The module may also be used for various other treatments, such as a germane treatment. The system 700 also includes one or more wafer source modules 701, where wafers are stored before and after processing. An atmospheric robot (not shown) in the atmospheric transfer chamber 719 may first remove wafers from the source modules 701 to loadlocks 721. A wafer transfer device (generally a robot arm unit) in the transfer module 703 moves the wafers from loadlocks 721 to and among the modules mounted on the transfer module 703.

In various embodiments, a system controller 750 is employed to control process conditions during deposition. The controller 750 will typically include one or more memory devices and one or more processors. A processor may include a CPU or computer, analog and/or digital input/output connections, stepper motor controller boards, etc.

The controller 750 may control all of the activities of the deposition apparatus. The system controller 750 executes system control software, including sets of instructions for controlling the timing, mixture of gases, chamber pressure, chamber temperature, wafer temperature, radio frequency (RF) power levels, wafer chuck or pedestal position, and other parameters of a particular process. Other computer programs stored on memory devices associated with the controller 750 may be employed in some embodiments.

Typically there will be a user interface associated with the controller 750. The user interface may include a display screen, graphical software displays of the apparatus and/or process conditions, and user input devices such as pointing devices, keyboards, touch screens, microphones, etc.

System control logic may be configured in any suitable way. In general, the logic can be designed or configured in hardware and/or software. The instructions for controlling the drive circuitry may be hard coded or provided as software. The instructions may be provided by "programming." Such programming is understood to include logic of any form, including hard coded logic in digital signal processors, application-specific integrated circuits, and other devices which have specific algorithms implemented as hardware. Programming is also understood to include software or firmware instructions that may be executed on a general purpose processor. System control software may be coded in any suitable computer readable programming language.

The computer program code for controlling the germanium-containing reducing agent pulses, hydrogen flow, and tungsten-containing precursor pulses, and other processes in a process sequence can be written in any conventional computer readable programming language: for example, assembly language, C, C++, Pascal, Fortran, or others. Compiled object code or script is executed by the processor to perform the tasks identified in the program. Also as indicated, the program code may be hard coded.

The controller parameters relate to process conditions, such as, for example, process gas composition and flow rates, temperature, pressure, cooling gas pressure, substrate temperature, and chamber wall temperature. These parameters are provided to the user in the form of a recipe, and may be entered utilizing the user interface.

Signals for monitoring the process may be provided by analog and/or digital input connections of the system controller 750. The signals for controlling the process are output on the analog and digital output connections of the deposition apparatus 700.

The system software may be designed or configured in many different ways. For example, various chamber component subroutines or control objects may be written to control operation of the chamber components necessary to carry out the deposition processes in accordance with the disclosed embodiments. Examples of programs or sections of programs for this purpose include substrate positioning code, process gas control code, pressure control code, and heater control code.

A substrate positioning program may include program code for controlling chamber components that are used to load the substrate onto a pedestal or chuck and to control the spacing between the substrate and other parts of the chamber such as a gas inlet and/or target. A process gas control program may include code for controlling gas composition and flow rates and optionally for flowing gas into the chamber prior to deposition in order to stabilize the pressure in the chamber. A pressure control program may include code for controlling the pressure in the chamber by regulating, e.g., a throttle valve in the exhaust system of the chamber. A heater control program may include code for controlling the current to a heating unit that is used to heat the substrate. Alternatively, the heater control program may control delivery of a heat transfer gas such as helium to the wafer chuck.

Examples of chamber sensors that may be monitored during deposition include mass flow controllers, pressure sensors such as manometers, and thermocouples located in the pedestal or chuck. Appropriately programmed feedback and control algorithms may be used with data from these sensors to maintain desired process conditions.

The foregoing describes implementation of disclosed embodiments in a single or multi-chamber semiconductor processing tool. The apparatus and process described herein may be used in conjunction with lithographic patterning tools or processes, for example, for the fabrication or manufacture of semiconductor devices, displays, LEDs, photovoltaic panels, and the like. Typically, though not necessarily, such tools/processes will be used or conducted together in a common fabrication facility. Lithographic patterning of a film typically comprises some or all of the following steps, each step provided with a number of possible tools: (1) application of photoresist on a workpiece, i.e., substrate, using a spin-on or spray-on tool; (2) curing of photoresist using a hot plate or furnace or UV curing tool; (3) exposing the photoresist to visible or UV or x-ray light with a tool such as a wafer stepper; (4) developing the resist so as to selectively remove resist and thereby pattern it using a tool such as a wet bench; (5) transferring the resist pattern into an underlying film or workpiece by using a dry or plasma-assisted etching tool; and (6) removing the resist using a tool such as an RF or microwave plasma resist stripper.

EXPERIMENTAL

Experiment 1

Thickness

Experiments were conducted that show the effect using a germanium-containing reducing agent during deposition of the tungsten nucleation layer had on nucleation layer growth rate and nucleation layer thickness. These experiments were conducted at 300° C.

Figure 8:
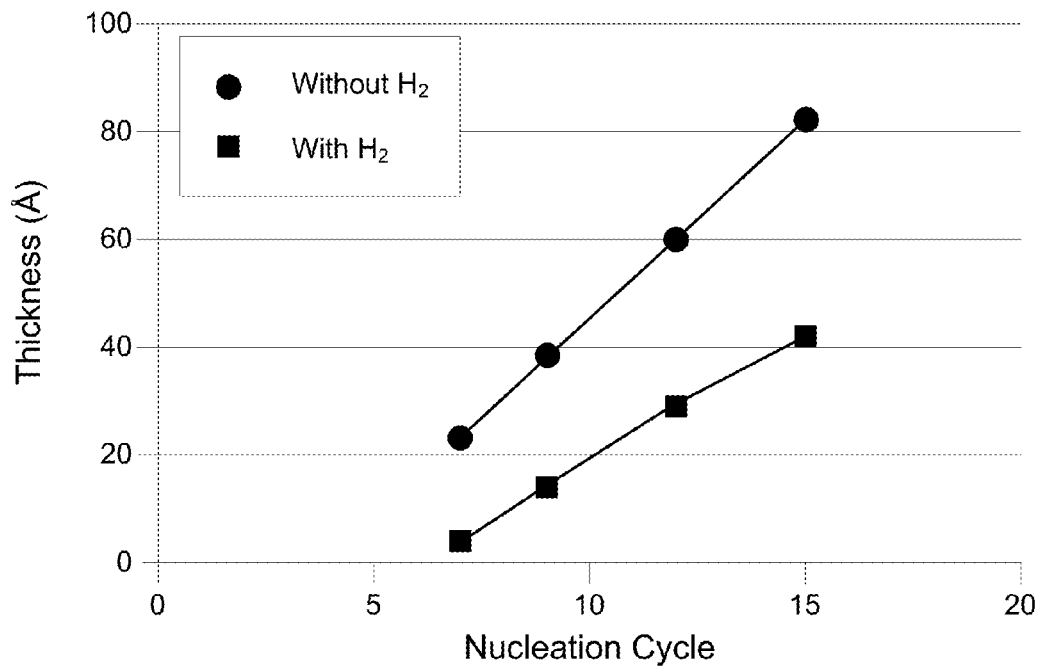
FIG. 8 is a plot illustrating film thickness as a function of nucleation deposition cycle in accordance with disclosed embodiments.

A first series of experiments involved processing substrates by (1) exposing the substrate to germane ($GeH_4$) without hydrogen present, (2) exposing the substrate to tungsten hexafluoride ($WF_6$), and (3) repeating steps (1) and (2) for various nucleation cycles. Germane was flowed at a flow rate of 250 sccm with a carrier gas argon with a flow rate of 1000 sccm. Tungsten hexafluoride was flowed at a flow rate of 270 sccm. The thickness of the deposited tungsten nucleation layer was measured at various nucleation cycles. The results are shown in FIG. 8 and are represented by the round points.

A second series of experiments involved processing substrates by (1) exposing the substrate to germane ($GeH_4$) in a hydrogen environment, (2) exposing the substrate to tungsten hexafluoride ($WF_6$), and (3) repeating steps (1) and (2) for various nucleation cycles. Germane was flowed at a flow rate of 250 sccm with a carrier gas argon with a flow rate of 1000 sccm. Hydrogen was flowed at a flow rate of 19,000 sccm throughout both the germane pulses and the tungsten hexafluoride pulses. Tungsten hexafluoride was flowed at a flow rate of 270 sccm. The thickness of the deposited tungsten nucleation layer was measured at various nucleation cycles. The results are represented in FIG. 8 by the square points.

A summary of the tungsten deposition rate (A per cycle) is shown in Table 1.

TABLE 1

| Tungsten Nucleation Layer Deposition Rate (Å/cycle) | | | | |
|---|---|---|---|---|
| | Without Hydrogen | | With Hydrogen | |
| Nucleation Cycle | Thickness (Å) | Thickness per Cycle | Thickness (Å) | Thickness per Cycle |
| 7 | 4 | 3.35 | 23 | 0.53 |
| 9 | 15 | 4.27 | 38 | 1.62 |
| 12 | 29 | 5.02 | 60 | 2.46 |
| 15 | 42 | 5.47 | 82 | 2.80 |

As shown, use of hydrogen flow during the tungsten nucleation layer deposition substantially decreased the thickness of the tungsten nucleation layer, which suggests that the presence of hydrogen decreases the amount of tungsten deposited per cycle using germane.

Experiment 2

Resistivity of Nucleation Layers

Experiments were conducted that show the effect using a germanium-containing reducing agent during deposition of the tungsten nucleation layer had on resistivity of the overall deposited tungsten nucleation layer. These experiments were conducted at 300° C.

Figure 9:
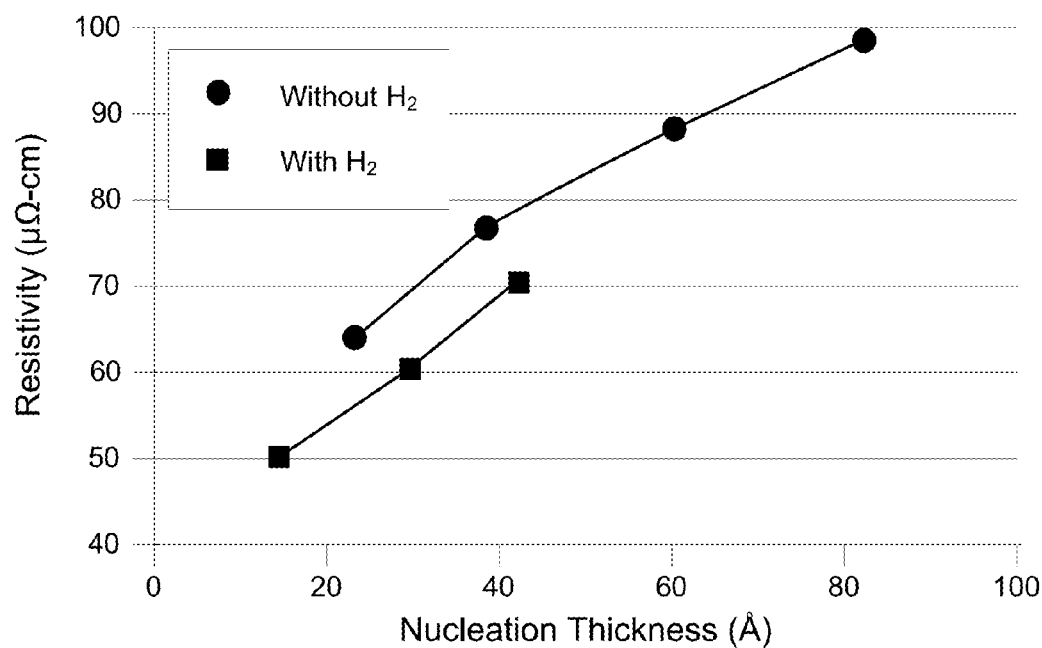
FIG. 9 is a plot illustrating resistivity as a function of film thickness in accordance with disclosed embodiments.

A first series of experiments involved processing substrates by (1) exposing the substrate to germane ($GeH_4$) without hydrogen present, (2) exposing the substrate to tungsten hexafluoride ($WF_6$), and (3) repeating steps (1) and (2) for various nucleation cycles. Germane was flowed at a flow rate of 250 sccm with a carrier gas argon at a flow rate of 1000 sccm. Tungsten hexafluoride was flowed at a flow rate of 270 sccm. The resistivity of the deposited tungsten nucleation layer was measured at various nucleation thicknesses. The results are shown in FIG. 9 and are represented by the round points.

A second series of experiments involved processing substrates by (1) exposing the substrate to germane ($GeH_4$) in a hydrogen environment, (2) exposing the substrate to tungsten hexafluoride ($WF_6$), and (3) repeating steps (1) and (2) for various nucleation cycles. Germane was flowed at a flow rate of 250 sccm with carrier gas argon at a flow rate of 1000 sccm. Hydrogen was flowed at a flow rate of 19,000 sccm throughout both the germane ($GeH_4$) pulses and the tungsten hexafluoride ($WF_6$) pulses. Tungsten hexafluoride ($WF_6$) was flowed at a flow rate of 270 sccm. The resistivity of the deposited tungsten nucleation layer was measured at various nucleation thicknesses. The results are represented in FIG. 9 by the square points.

A summary of the resistivity of the nucleation layers deposited using germane is shown in Table 2.

TABLE 2

Tungsten Nucleation Layer Resistivity (μΩ-cm)

| Without Hydrogen | | With Hydrogen | |
|---|---|---|---|
| Thickness (Å) | Resistivity (μΩ-cm) | Thickness (Å) | Resistivity (μΩ-cm) |
| 15 | 50.3 | 23 | 64.3 |
| 29 | 60.5 | 38 | 76.8 |
| 42 | 70.6 | 60 | 88.4 |
| | | 82 | 98.9 |

As shown, use of hydrogen flow during the tungsten nucleation layer deposition substantially decreased the resistivity of the tungsten nucleation layer.

The substrate with a tungsten nucleation layer thickness of 20 Å was further processed and bulk tungsten was deposited into features of the substrate. As a result, the overall resistivity was about 60 μΩ-cm, indicating that the resistivity did not change substantially. This is an unexpected result since bulk tungsten layers with thicknesses less than 100 Å deposited on nucleation layers that were deposited using conventional methods, such as with diborane, generally show a small increase in resistivity after bulk tungsten is deposited. This supports the theory that substantially all of the tungsten deposited into the features may be alpha-tungsten, e.g., low-resistivity tungsten, since 40 Å of tungsten was deposited over the 20 Å nucleation layer and the resistivity did not substantially change.

Experiment 3

Overall Resistivity

Experiments were conducted to determine the effect using a germanium-containing reducing agent during deposition of the tungsten nucleation layer had on resistivity of the overall deposited tungsten after bulk tungsten was deposited by chemical vapor deposition (CVD).

Three processes were conducted on substrates to deposit nucleation layers and bulk tungsten fill. As an example, process conditions in this experiment are listed in Table 3.

TABLE 3

Process Conditions

| Process | Nucleation Layer | Treatment | Bulk Layer |
|---|---|---|---|
| A | 300° C.<br>GeH$_4$/WF$_6$ Pulses | None | 300° C.<br>CVD |
| B | 300° C.<br>2 cycles of<br>B$_2$H$_6$/WF$_6$ Pulses | 300° C.<br>3 cycles of<br>B$_2$H$_6$/WF$_6$ Pulses | 300° C.<br>CVD |
| C | 250° C.<br>2 cycles of<br>B$_2$H$_6$/WF$_6$ Pulses | 325° C.<br>5 cycles of<br>B$_2$H$_6$ Pulses | 325° C.<br>CVD |

Figure 10:
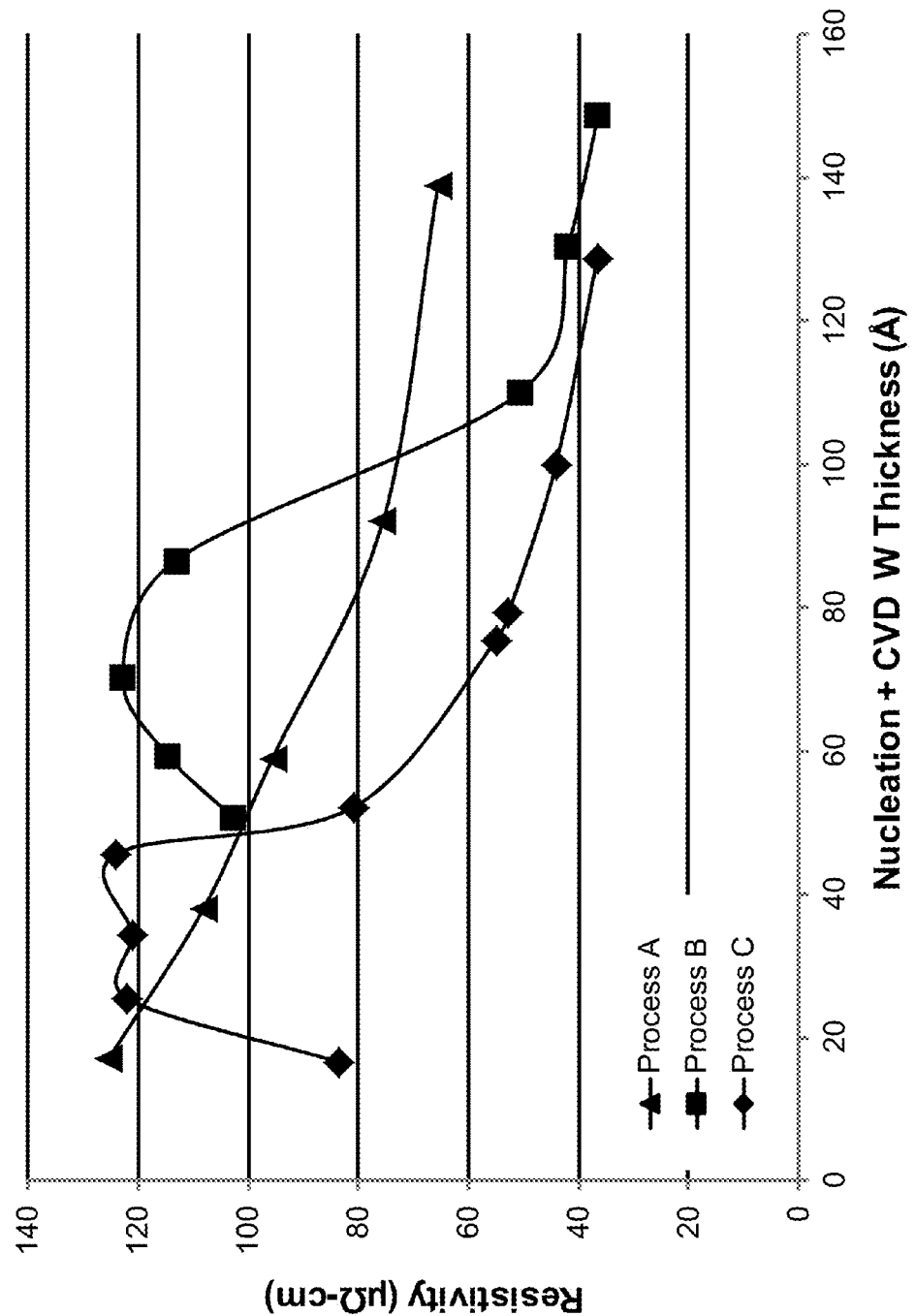
FIG. 10 is a plot illustrating resistivity of deposited tungsten films in accordance with disclosed embodiments.

In Process A, substrates were processed by (1) exposing the substrate to germane (GeH$_4$) with hydrogen present, (2) exposing the substrate to tungsten hexafluoride (WF$_6$), (3) repeating steps (1) and (2) for various nucleation cycles, and (4) depositing bulk tungsten by CVD. Substrates were processed at 300° C. for both the nucleation layer deposition and the bulk tungsten deposition. For the nucleation layer deposition, germane was flowed at a flow rate of 250 sccm with a carrier gas argon with a flow rate of 1000 sccm. Hydrogen was flowed at a flow rate of about 19,000 sccm in the front end and 13,000 sccm in the back end. In Processes B and C, substrates were processed using diborane (B$_2$H$_6$) in two optimized processes. The resistivity of the deposited tungsten layer was measured at various cumulative thicknesses of the nucleation layer and bulk CVD layer. The results are shown in FIG. 10. Process A results are represented by the triangular points, Process B results are represented by the square points, and Process C results are represented by the diamond points. For purposes of this experiment, the point for each process with the lowest thickness is the substrate with only a nucleation layer deposited. Subsequent points corresponding to greater thicknesses represent the resistivities of the overall nucleation layer and deposited tungsten layer by CVD.

Both Process B and Process C involved use of diborane to deposit the nucleation layer, and both of these processes exhibit a sharp increase in resistivity in the overall tungsten film upon deposition of the bulk tungsten layer by CVD. For example, the resistivity of the substrate in Process B increased from 102.6 μΩ-cm to 114.6 μΩ-cm, and the resistivity of the substrate in Process C increased from 83.4 μΩ-cm to 122.1 μΩ-cm. An unexpected result for Process A is shown. After deposition of the bulk tungsten layer, the resistivity of the substrate decreased from 125.4 μΩ-cm to 108.2 μΩ-cm. According to the trend described above with respect to FIG. 2, this supports the theory that deposition of the nucleation layer using a germanium-containing reducing agent such as germane promotes alpha-tungsten growth because if beta-tungsten were deposited, a sharp increase in resistivity would be shown in the data, similar to the ones represented in Processes B and C. It should be noted that the increase in resistivities for Processes B and C occur at relatively thin thicknesses (e.g., between 40 Å and 80 Å for Process B and about 20 Å and 60 Å for Process C). Accordingly, the germanium-based nucleation process described herein may be particularly suitable for deposition of relatively thin tungsten films, e.g., at less than about 100 Å.

It is noted that although the measurements of resistivity in Process A are higher than some of the resistivities measured in Processes B and C, both Processes B and C have been optimized. Further optimization of the deposition of nucleation layers using germanium-containing compounds for tungsten deposition, decreased overall resistivity may be expected.

Conclusion

Although the foregoing embodiments have been described in some detail for purposes of clarity of understanding, it will be apparent that certain changes and modifications may be practiced within the scope of the appended claims. It should be noted that there are many alternative ways of implementing the processes, systems and apparatus of the present embodiments. Accordingly, the present embodiments are to be considered as illustrative and not restrictive, and the embodiments are not to be limited to the details given herein.

What is claimed is:

1. A method of filling a feature on a substrate with tungsten, the method comprising:
   prior to depositing a bulk tungsten layer, forming a tungsten nucleation layer by exposing the feature to alternating pulses of a germanium-containing reducing agent and a tungsten-containing precursor.

2. The method of claim 1, wherein the tungsten nucleation layer is formed to a thickness between 1 nm and 20 nm.

3. The method of claim 1, wherein the tungsten nucleation layer is formed to a thickness less than 1 nm.

4. The method of claim 1, wherein the amount of tungsten deposited per cycle is less than about 8 Å.

5. The method of claim 1, wherein the tungsten nucleation layer is formed in a hydrogen atmosphere.

6. The method of claim 1, wherein substantially all of the tungsten formed in the feature comprises alpha-tungsten.

7. The method of claim 1, wherein the germanium-containing reducing agent is germane ($GeH_4$) or digermane ($Ge_2H_6$).

8. The method of claim 1, further comprising depositing a bulk tungsten layer on the tungsten nucleation layer by chemical vapor deposition.

9. The method of claim 8, wherein grain growth during the bulk tungsten layer deposition extends from a first site where tungsten nucleated to a second site where tungsten nucleated in the feature.

10. The method of claim 8, wherein substantially all of the tungsten formed in the feature comprises alpha-tungsten.

11. A method of filling a feature on a substrate with tungsten, the method comprising:

forming a tungsten nucleation layer, and after forming the tungsten nucleation layer and prior to depositing a tungsten bulk layer, treating the tungsten nucleation layer to pulses of a germanium-containing reducing agent.

12. The method of claim 11, wherein no intervening pulses of other precursors are pulsed during the treatment.

13. The method of claim 11, wherein the treatment further comprises intervening pulses of a tungsten-containing precursor, and wherein the amount of the tungsten-containing precursor pulsed during the treatment is less than the amount of the tungsten-containing precursor pulsed during the nucleation layer formation.

14. The method of claim 11, wherein the treatment further comprises intervening pulses of a tungsten-containing precursor, wherein substantially no tungsten is deposited during the treatment.

15. The method of claim 11, wherein the germanium-containing reducing agent is germane ($GeH_4$) or digermane ($Ge_2H_6$).

\* \* \* \* \*